United States Patent [19]
Ono et al.

[11] Patent Number: 6,028,265
[45] Date of Patent: Feb. 22, 2000

[54] OPTICAL SEMICONDUCTOR ELECTRODE, PHOTOELECTRIC CONVERTING DEVICE, AND PHOTOELECTRIC CONVERSION METHOD

[75] Inventors: Yoshiyuki Ono; Akira Imai; Hidekazu Hirose; Katsuhiro Sato, all of Minami-Ashigara, Japan

[73] Assignee: Fuji Xerox Co., Ltd., Tokyo, Japan

[21] Appl. No.: 08/988,399

[22] Filed: Dec. 10, 1997

[30] Foreign Application Priority Data

Dec. 16, 1996 [JP] Japan ..................................... 8-336161
Dec. 9, 1997 [JP] Japan ..................................... 9-338371

[51] Int. Cl.[7] ..................... H01L 31/0224; H01L 31/042; H01L 31/055
[52] U.S. Cl. ..................... 136/263; 136/261; 136/265; 136/253; 136/252; 136/260; 136/262; 136/257; 257/40; 257/43; 257/431; 429/111; 429/209; 429/212; 429/213; 429/218; 429/222; 429/231
[58] Field of Search ..................... 136/263, 261, 136/265, 253, 252, 260, 262, 257; 257/40, 43, 431; 429/111, 209, 212, 213, 218, 222, 231

[56] References Cited

U.S. PATENT DOCUMENTS 5,084,365 1/1992 Gratzel et al. ..................... 429/111
5,885,368 3/1999 Lupo et al. ..................... 136/263

FOREIGN PATENT DOCUMENTS 55-124964 9/1980 Japan .
1-220380 9/1989 Japan .

OTHER PUBLICATIONS

Fujishima, A. et al. "Electrochemical Photolysis of Water at a Semiconductor Electrode." *Nature*, vol. 238, Jul. 7, 1972, pp. 37–38.

Osa, T. et al. "Photocell Using Covalently–Bound Dyes on Semiconductor Surfaces." *Nature*, vol. 264, Nov. 25, 1976, pp. 349–350.

Schouten, P. et al. "Charge Migration in Supramolecular Stacks of Peripherally Substituted Porphyrins." *Nature*, vol. 353, Oct. 24, 1991, pp. 736–737.

*Primary Examiner*—Alan Diamond
*Attorney, Agent, or Firm*—Oliff & Berridge, PLC

[57] ABSTRACT

The photo-semiconducting electrode of the present invention comprises a semiconducting substrate, a chemically adsorbed film formed thereon composed of at least one compound selected from the compounds represented by the formulas: formulas (I) $R^1M^1Y_{13}$, (II) $R^1R^2M^1Y^1_2$, (III) $R^1R^2R^3M^1Y^1$ and (IV) $R^1$—SH, respectively, and a dye which is fixed to the surface of the chemically adsorbed film and has a functional group capable of reacting with a halogen atom. Because of this, the photo-semiconductor electrode of the present invention is capable of efficiently absorbing solar light and performing energy conversion and superior in photoelectric conversion efficiency, stability and durability. In addition, it can be easily produced.

19 Claims, 10 Drawing Sheets

OPTICAL SEMICONDUCTOR ELECTRODE, PHOTOELECTRIC CONVERTING DEVICE, AND PHOTOELECTRIC CONVERSION METHOD

BACKGROUND OF THE INVENTION

1. Field of the Invention

The present invention relates to a photo-semiconductor electrode, a photoelectric converting device and a photoelectric conversion method. More particularly, the present invention relates to a photo-semiconductor electrode capable of converting light energy into electrical energy, a photoelectric converting device and a photoelectric conversion method.

2. Description of the Related Art

The global warming due to the burning of fossil fuels and the increase in the demand for energy due to the increase in population are now posing serious problems that relate to the existence of mankind. Needless to say, from time immemorial, solar light has supported global environments and is an energy source for all living things including mankind.

Recently, attempts have been made to use solar light as a limitless source of energy which is clean and not associated with the generation of hazardous substances. Well known devices which directly convert light energy into electrical energy, are solar cells. They are made of p-n junctions formed on inorganic semiconductors such as silicon or gallium arsenide. They have been put to practical use as the power source of, for example, remote control or portable electronic apparatus.

However, in order for these solar cells to be used as an energy source, a difficult problem needs to be solved. The problem is that a large amount of energy and cost is necessary for the production of these solar cells, although these solar cells have a high conversion efficiency.

Another method for converting light radiant energy into electrical energy is seen in the wet-process solar cell which utilizes a photo-electrochemical reaction occurring in an interface between a semiconductor and an electrolyte solution. An oxide semiconductor, such as titanium oxide or tin oxide, which is used in the wet-process, is expected to be a useful material for the conversion, because the oxide semiconductor can be produced with a far lower amount of energy and cost in comparison with the aforementioned semiconductors such as silicon or gallium arsenide. However, the problem of the photo-semiconductors such as titanium oxide and zinc oxide which are stable is that a high conversion efficiency of energy cannot be expected because the band gap of these semiconductors is as broad as 3 eV and therefore these semiconductors are capable of utilizing only ultraviolet light. This accounts for only about 4 percent of sunlight.

Accordingly, it is reported that the photoelectric energy conversion efficiency can be increased by using as a photoelectrode a modified electrode prepared by natural adsorption onto the surface of the photo-electrode of a substance which has a small band gap and which is exemplified by an organic dye such as a xanthene dye or a cyanine dye and a transition metal complex such as tris(2,2'-bipyridyl) ruthenium(II) (see, for example, T. Osa, M. Fujihira, ibid., 264, 349, (1976), Brian O'Regan, Michael Gratzel, Nature., 353, 736 (1991), and Japanese Patent Application Laid-Open (JP-A) No.1-220,380).

However, the above-described electrode, which was prepared by natural adsorption of a dye onto the surface of the photo-electrode, presented the problem that chemical stability and electrochemical stability were insufficient and the durability was also insufficient because the adsorbed dye was liable to come off.

In order to solve the problem of the prior art, a method was proposed which comprised fixing the dye on the surface of a semiconductor via y-aminopropyltriethoxysilane (JP-A No. 55-124,964). This method, however, still has a problem that little of the pigment is fixed to the surface of the semiconductor, and the function as an electrode is insufficient.

The task of the present invention is to achieve the following object by solving the above-described problems of prior art.

That is, the object of the present invention is to provide a photo-semiconductor electrode which is capable of efficiently absorbing solar light and performing energy conversion and which is superior in photoelectric conversion efficiency, stability and durability and can be easily produced. Another object is to provide a photoelectric conversion method using the photo-semiconductor electrode and a photoelectric converting device suitable for the implementation of the photoelectric conversion method.

SUMMARY OF THE INVENTION

After studies of a photo-semiconductor electrode capable of effectively absorbing solar light and efficiently converting the light energy into electric energy and chemical energy, a photoelectric converting device and a photoelectric conversion method, the present inventors found that the use as a photo-electrode of a photo-semiconductor electrode comprising a semiconductor whose surface had a dye fixed thereto by a specific method made it possible to absorb solar light and perform energy conversion in an efficient way and that the photo-semiconductor electrode was superior in durability and stability.

The present invention is made based on the above-mentioned findings, and the aforementioned problems are solved by the following means.

(1) A photo-semiconductor electrode comprising a semiconducting material, a film formed thereon and composed of at least one compound selected from the group consisting of compounds represented by the following formulas (I), (II), (III) and (IV), respectively, and a dye which is fixed to the surface of the film and has a functional group capable of reacting with a halogen atom:

| | |
|---|---|
| $R^1 M^1 Y^1_3$ | Formula (I) |
| $R^1 R^2 M^1 Y^1_2$ | Formula (II) |
| $R^1 R^2 R^3 M^1 Y^1$ | Formula (III) |
| $R^1$—SH | Formula (IV) | where $R^1$ is a saturated or unsaturated aliphatic hydrocarbon group, an aromatic hydrocarbon group or a heterocycle-containing group, each having at least one halogen atom; $R^2$ and $R^3$ are either the same as $R^1$ or each represents a saturated or unsaturated aliphatic hydrocarbon group, an aromatic hydrocarbon group or a heterocycle-containing group; $M^1$ is a tetravalent element other than carbon; and $Y^1$ represents a hydrolyzable functional group and is a halogen atom or an alkoxy group.

(2) A photo-semiconductor electrode according to (1), wherein the functional group capable of reacting with a halogen atom is selected from the group consisting of a carboxyl group and a primary amine.

(3) A photo-semiconductor electrode according to (1) or (2), wherein $M^1$ is selected from the group consisting of silicon, germanium, tin, titanium and zirconium.

(4) A photo-semiconductor electrode according to any one of (1) to (3), wherein the dye is at least one compound selected from the group consisting of compounds represented, respectively, by the following formulas (V), (VI), (VII), (VIII), (IX), (X), (XI) and (XII):

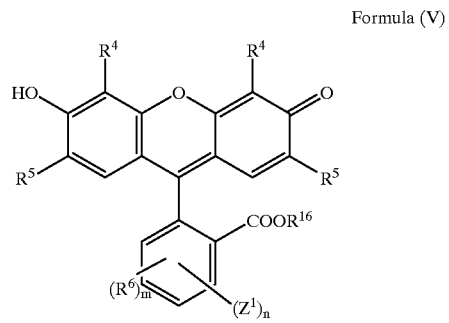

Formula (V)

where $R^4$, $R^5$ and $R^6$ are selected from the group consisting of a hydrogen atom, a halogen atom, —$NO_2$, —OH, an alkyl group which may be substituted and has 1 to 10 carbon atoms and an aromatic hydrocarbon group which may be substituted; m is 1, 2, 3 or 4; $R^7$ is a hydrogen atom or an aliphatic hydrocarbon group having 1 to 10 carbon atoms; $Z^1$ is selected from the group consisting of a hydrogen atom, —$NH_2$, —$NHR^8$, —OH and —COOH; n is 0, 1 or 2; and $R^8$ is an aliphatic hydrocarbon group which may be substituted and has 1 to 4 carbon atoms.

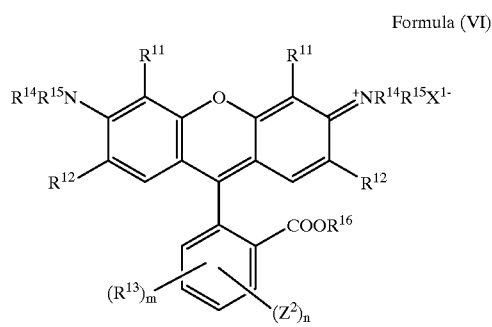

Formula (VI)

where $R^{11}$, $R^{12}$ and $R^{13}$ are selected from the group consisting of a hydrogen atom, a halogen atom, —$NO_2$, —OH, an alkyl group which may be substituted and has 1 to 10 carbon atoms and an aromatic hydrocarbon group which may be substituted; m is 1 or 2; $R^{14}$ and $R^{15}$ are selected from the group consisting of a hydrogen atom, an aliphatic hydrocarbon group which may be substituted and has 1 to 10 carbon atoms and an aromatic hydrocarbon group which may be substituted; $X^{1-}$ is a counter ion; $R^{16}$ is a hydrogen atom or an aliphatic hydrocarbon group having 1 to 10 carbon atoms; $Z^2$ is selected from the group consisting of a hydrogen atom, —$NH_2$, —$NHR^{17}$, —OH and —COOH; n is 0, 1 or 2; and $R^{17}$ is an aliphatic hydrocarbon group which may be substituted and has 1 to 4 carbon atoms, with the proviso that $Z^2$ is selected from the group consisting of —$NH_2$, —$NHR^{17}$, —OH and —COOH and n is 1 or 2 if all of $R^{14}$, $R^{15}$ and $R^{16}$ are a group other than a hydrogen atom.

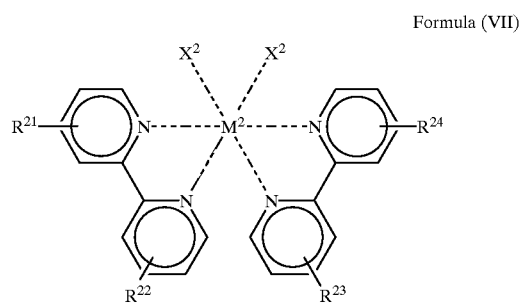

Formula (VII)

where $M^2$ is Fe, Ru or Os; $X^2$ is selected from the group consisting of a halogen atom, —OH, —CN and —SCN; $R^{21}$ to $R^{24}$ are selected from the group consisting of a hydrogen atom, a halogen atom, —$NO_2$, —COOH, —$NH_2$, —$NHR^{25}$, an aliphatic hydrocarbon group which may be substituted and has 1 to 10 carbon atoms, an aromatic hydrocarbon group which may be substituted and a heterocyclic group; $R^{25}$ is an aliphatic hydrocarbon group which may be hydrocarbon group; and at least one of $R^{21}$ to $R^{24}$ is selected from the group consisting of —COOH, —OH, —$NH_2$, —$NHR^{25}$ and a pyridyl group.

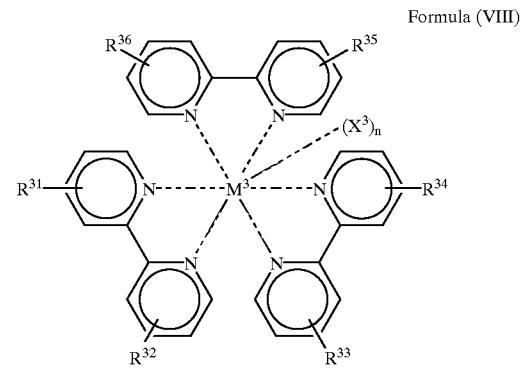

Formula (VIII)

where $M^3$ is Fe, Ru or Os; $X^3$ is selected from the group consisting of a halogen atom, —$SO_4$, —$ClO_4$, —OH, —CN and —SCN; n is 0, 1 or 2; $R^{31}$ to $R^{36}$ are selected from the group consisting of a hydrogen atom, a halogen atom, —$NO_2$, —COOH, —OH, —$NH_2$, —$NHR^{37}$, an aliphatic hydrocarbon group having 1 to 10 carbon atoms, an aromatic hydrocarbon group and a heterocyclic group; $R^{37}$ is an aliphatic hydrocarbon group which may be substituted and has 1 to 4 carbon atoms or an aromatic hydrocarbon group; and at least one of $R^{31}$ to $R^{36}$ is selected from the group consisting of —COOH, —OH, —$NH_2$, —$NHR^{37}$ and a pyridyl group.

Formula (IX)

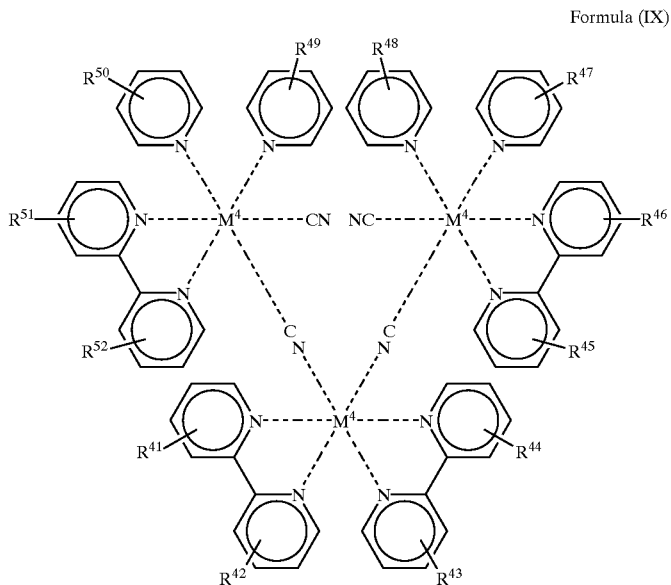

where $M^4$ is Fe, Ru or Os; $R^{41}$ to $R^{52}$ are selected from the group consisting of a hydrogen atom, a halogen atom, —$NO_2$, —COOH, —OH, —$NH_2$, —$NHR^{53}$, an aliphatic hydrocarbon group having 1 to 10 carbon atoms, an aromatic hydrocarbon group and a heterocyclic group; $R^{53}$ is an aliphatic group which may be substituted and has 1 to 4 carbon atoms or an aromatic hydrocarbon group; and at least one of $R^{41}$ to $R^{52}$ is selected from the group consisting of —COOH, —OH, —$NH_2$, —$NHR^{53}$ and a pyridyl group.

Formula (X)

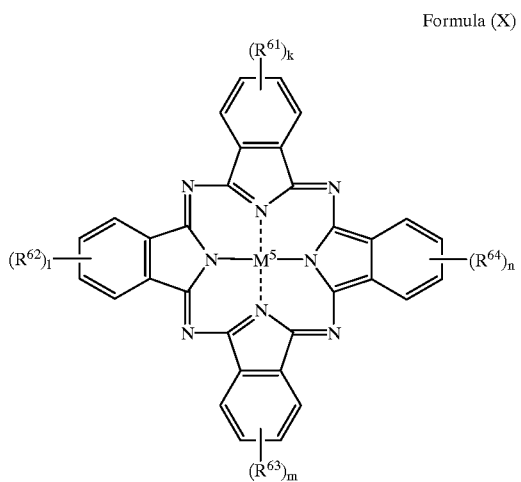

where $M^5$ is selected from the group consisting of $(H)_2$, Mg, TiO, VO, Mn, Fe, Co, Ni, Cu, Zn, GaOH, GaCl, InOH, InCl and SnO; $R^{61}$ to $R^{64}$ are selected from the group consisting of a hydrogen atom, a halogen atom, —$NO_2$, —$NH_2$, —$NHR^{65}$, —OH, —COOH, an aliphatic hydrocarbon group which may be substituted and has 1 to 10 carbon atoms, an aromatic hydrocarbon group which may be substituted and a heterocyclic group; at least one of $R^{61}$ to $R^{64}$ is selected from the group consisting of —$NH_2$, —$NHR^{65}$, —OH and —COOH; $R^{65}$ is an aliphatic group which may be substituted and has 1 to 4 carbon atoms or an aromatic hydrocarbon group; and k, l, m and n are each 1 or 2.

Formula (XI)

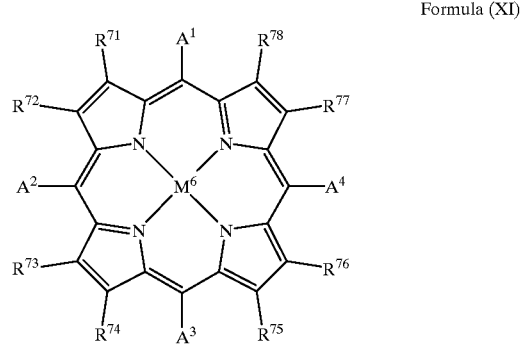

where $M^4$ is selected from the group consisting of $(H)^2$, Mg, Zn, Ni, Co, Cu and Pd; $R^{71}$ to $R^{78}$ are selected from the group consisting of a hydrogen atom, a halogen atom, a hydroxyl group, an alkoxy group which may be substituted and has 1 to 4 carbon atoms, an aliphatic hydrocarbon group which may be substituted and has 1 to 10 carbon atoms and an aromatic hydrocarbon group which may be substituted; $A^1$ to $A^4$ are each an aromatic hydrocarbon group which may be substituted or a heterocyclic group; at least one of $A^1$ to $A^4$ is a phenyl group substituted with a group selected from the group consisting of —$NH_2$, —$NHR^{79}$, —OH and —COOH or a pyridyl group; and $R^{79}$ is an aliphatic group which may be substituted and has 1 to 4 carbon atoms or an aromatic hydrocarbon group.

Formula (XII)

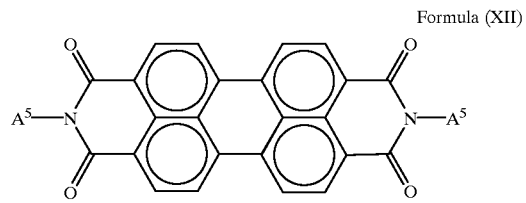

where $A^5$ is an aliphatic hydrocarbon group substituted with a group selected from the group consisting of —$NH_2$, —NHR⁸¹, —OH, —COOH and a pyridyl group, an aromatic hydrocarbon group substituted with a group selected from the group consisting of —NH₂, —NHR⁸¹, —OH, —COOH and a pyridyl group, or a pyridyl group; and R⁸¹ is an aliphatic hydrocarbon group which may be substituted and has 1 to 4 carbon atoms or an aromatic hydrocarbon group.

(5) A photo-semiconductor electrode according to any one of (1) to (4), wherein the semiconducting material is selected from the group consisting of titanium oxide, tin oxide, tungsten oxide, zinc oxide, indium oxide, niobium oxide and strontium oxide.

(6) A photo-semiconductor electrode according to any one of (1) to (4), wherein the semiconducting material is titanium oxide.

(7) A photoelectric converting device comprising a pair of electrodes placed in an electrolyte solution and a connecting means which enables an electric current to flow between the pair of electrodes, wherein at least one of the pair of electrodes is the photo-semiconductor electrode according to any one of (1) to (6).

(8) A photoelectric conversion method comprising irradiating light onto a pair of electrodes connected such that an electric current flows therebetween and placed in an electrolyte solution in order to cause a photoelectric conversion reaction, wherein at least one of the pair of electrodes is the photo-semiconductor electrode according to any one of (1) to (6).

(9) A photoelectric conversion method according to (8), wherein the photoelectric conversion reaction is an electrolysis reaction.

DESCRIPTION OF THE PREFERRED EMBODIMENTS

Figure 1:
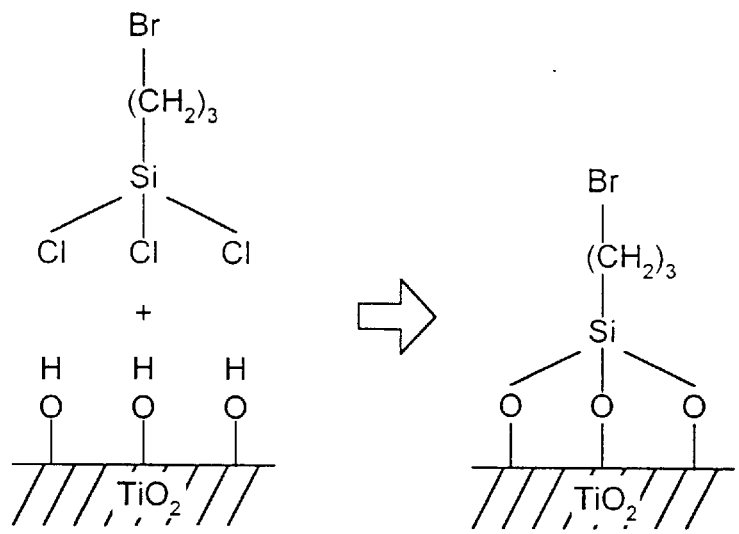
FIG. 1 is an enlarged conceptual diagram illustrating an example of the state where a chemically adsorbed film is formed on the surface of a semiconducting material.

Details of the photo-semiconductor electrode, a photoelectric converting device and a photoelectric conversion method of the present invention are explained below.

Photo-Semiconducting Electrode

The photo-semiconducting electrode of the present invention comprises a semiconducting material, a film formed on the surface of the semiconducting material and a dye fixed to the surface of the film.

Semiconducting Material

The shape, structure and size of the semiconducting material are not particularly limited, and these may be selected appropriately depending on purposes. The semiconducting material is used as a substrate. The substrate may be composed of a semiconducting material alone or may be a combination of a substrate appropriately selected such as glass and a coating film made from a semiconducting material formed on the substrate.

The semiconducting material is not particularly limited, and it may be appropriately selected from, for example, an n-type semiconductor and a p-type semiconductor depending on purposes.

Examples of the n-type semiconductor include titanium oxide, cadmium sulfide, strontium titanate, tungsten oxide, zinc oxide, indium oxide, niobium oxide, tin oxide and molybdenum disulfide.

Examples of the p-type semiconductor include gallium phosphide, gallium arsenide and indium phosphide.

Among these materials, titanium oxide, tin oxide, tungsten oxide, zinc oxide, indium oxide, niobium oxide and strontium titanate are preferable from the viewpoint of properties, chemical stability and processability. And, titanium oxide is particularly preferable.

Film

The above-mentioned film is a chemically adsorbed film (a chemically adsorbed monomolecular or built-up film) composed of at least one compound represented by any one of the following formulas (I) to (IV):

R¹M¹Y¹₃    Formula (I)

R¹R²M¹Y¹₂    Formula (II)

R¹R²R³M¹Y¹    Formula (III)

R¹—SH    Formula (IV)

where R¹ is a saturated or unsaturated aliphatic hydrocarbon group, an aromatic hydrocarbon group or a heterocycle-containing group, each having at least one halogen atom; R² and R³are either the same as R¹ or each represents a saturated or unsaturated aliphatic hydrocarbon group, an aromatic hydrocarbon group or a heterocycle-containing group; M¹ is a tetravalent element other than carbon; and Y¹ represents a hydrolyzable functional group and is a halogen atom or an alkoxy group.

The film is formed on the surface of the aforementioned semiconducting material as a result of a reaction between the semiconducting material and at least one compound which is represented by any one of the formulas (I) to (IV) and which has a halogen atom as a reactive group causing a mild interaction with the semiconducting material.

Examples of the compound represented by any one of the following formulas (I) to (IV) include
p-bromophenyltrichlorosilane[p-BrPhSiCl$_3$],
p-bromophenyltrimethoxysilane[p-BrPhSi(OCH$_3$)$_3$],
o-bromophenyltrichlorosilane[o-BrPhSiCl$_3$],
o-bromophenyltrimethoxysilane[o-BrPhSi(OCH$_3$)$_3$],
m-bromophenyltrichlorosilane[m-BrPhSiCl$_3$],
m-bromophenyltrimethoxysilane[m-BrPhSi(OCH$_3$)$_3$],
(p-bromomethyl)phenyltrichlorosilane[p-BrCH$_2$PhSiCl$_3$],
(p-bromomethyl)phenyltrimethoxysilane[p-BrCH$_2$PhSi(OCH$_3$)$_3$],
bromomethyltrichlorosilane[BrCH$_2$SiCl$_3$],
bromomethyltrichlorogermane[BrCH$_2$GeCl$_3$],
bromomethyltrimethoxysilane[BrCH$_2$Si(OCH$_3$)$_3$],
bromomethyltrimethoxygermane[BrCH$_2$Ge(OCH$_3$)$_3$],
bromomethyltriethoxysilane[BrCH$_2$Si(OCH$_2$H$_3$)$_3$],
bromomethyldimethylchlorosilane[BrCH$_2$Si(CH$_3$)$_2$Cl],
bromomethyldimethylchlorogermane[BrCH$_2$Ge(CH$_3$)$_2$Cl],
2-bromoethyltrichlorosilane[CH$_3$CHBrSiCl$_3$],
2-bromoethyltrichlorogermane[CH$_3$CHBrGeCl$_3$],
1.2-dibromoethyltrichlorosilane[BrCH$_2$CHBrSiCl$_3$],
1.2-dibromoethyltrichlorogermane[BrCH$_2$CHBrGeCl$_3$],
3-bromopropyltrichlorogermane[(Br(CH$_2$)$_3$GeCl$_3$],
4-bromobutyldimethylchlorosilane[Br(CH$_2$)$_4$Si(CH$_3$)$_2$Cl],
3-bromopropyltrichlorosilane[Br(CH$_2$)$_3$SiCl$_3$],
3-bromopropyltrimethoxysilane[Br(CH$_2$)$_3$Si(OCH$_3$)$_3$],
3-bromopropyltriethoxysilane[Br(CH$_2$)$_3$Si(OCH$_2$CH$_3$)$_3$],
8-bromooctyltrichlorosilane[Br(CH$_2$)$_8$SiCl$_3$],
8-bromooctyltrimethoxysilane[Br(CH$_2$)$_8$Si(OCH$_3$)$_3$],
8-bromooctyltriethyoxysilane[Br(CH$_2$)$_8$Si(OCH$_2$CH$_3$)$_3$],
8-bromooctyldimethylchlorosilane[(Br(CH$_2$)$_8$Si(CH$_3$)$_2$Cl],
11-bromoundecyltrichlorosilane[Br(CH$_2$)$_{11}$SiCl$_3$],
11-bromoundecyltrimethoxysilane[Br(CH$_2$)$_{11}$Si(OCH$_3$)$_3$],
11-bromoundecyltriethoxysilane[Br(CH$_2$)$_{11}$Si(OCH$_2$CH$_3$)$_3$],
3-bromopropyltrichlorogermane[Br(CH$_2$)$_3$GeCl$_3$],
bromomethyltribromogermane[(BrCH$_2$GeBr$_3$],
p-chlorophenyltrichlorosilane[p-ClPhSiCl$_3$],
p-chlorophenyltrimethoxysilane[p-ClPhSi(OCH$_3$)$_3$],
m-chlorophenyltrichlorosilane[m-ClPhSiCl$_3$],
o-chlorophenyltrimethoxysilane[o-ClPhSi(OCH$_3$)$_3$],
(p-chloromethyl)phenyltrichlorosilane[p-ClCH$_2$PhSiCl$_3$],
(p-chloromethyl)phenyltrimethoxysilane[p-ClCH$_2$PhSi(OCH$_3$)$_3$],
(p-chloromethyl)phenylmethyldichlorosilane[p-ClCH$_2$PhSi(CH$_3$)Cl$_2$],
(p-chloromethyl)phenyldimethylchlorosilane[p-ClCH$_2$PhSi(CH$_3$)$_2$Cl],
(p-chloromethyl)phenyltri-n-propoxysilane[p-ClCH$_2$PhSi(O-n-C$_3$H$_7$)$_3$],
((p-chloromethyl)phenylethyl)trichlorosilane[p-ClCH$_2$Ph(CH$_2$)$_2$SiCl$_3$],
((p-chloromethyl)phenylethyl)methyldichlorosilane[(p-ClCH$_2$Ph(CH$_2$)$_2$Si(CH$_3$)Cl$_2$],
((p-chloromethyl)phenylethyl)dimethylchlorosilane[p-ClCH$_2$Ph(CH$_2$)$_2$Si(CH$_3$)$_2$Cl],
((p-chloromethyl)phenylethyl)trimethoxysilane[p-ClCH$_2$Ph(CH$_2$)$_2$Si(OCH$_3$)$_3$],
((m-chloromethyl)phenylethyl)trichlorosilane[m-ClCH$_2$Ph(CH$_2$)$_2$SiCl$_3$],
((m-chloromethyl)phenylethyl)methyldichlorosilane[m-ClCH$_2$Ph(CH$_2$)$_2$Si(CH$_3$)Cl$_2$],
((m-chloromethyl)phenylethyl)dimethylchlorosilane[m-ClCH$_2$Ph(CH$_2$)$_2$Si(CH$_3$)$_2$Cl],
((m-chloromethyl)phenylethyl)trimethoxysilane[m-ClCH$_2$Ph(CH$_2$)$_2$Si(OCH$_3$)$_3$],
((o-chloromethyl)phenylethyl)trichlorosilane[o-ClCH$_2$Ph(CH$_2$)$_2$SiCl$_3$],
((o-chloromethyl)phenylethyl)methyldichlorosilane[o-ClCH$_2$Ph(CH$_2$)$_2$Si(CH$_3$)Cl$_2$],
((o-chloromethyl)phenylethyl)dimethylchlorosilane[o-ClCH$_2$Ph(CH$_2$)$_2$Si(CH$_3$)$_2$Cl],
((o-chloromethyl)phenylethyl)trimethoxysilane[o-ClCH$_2$Ph(CH$_2$)$_2$(OCH$_3$)$_3$],
chloromethyltrichlorosilane[Cl$_3$CSiCl$_3$],
trichloromethyltrichlorosilane[Cl$_3$CSiCl$_3$],
trichloromethyltrichlorogermane[(Cl$_3$CGeCl$_3$],
chloromethyltrimethoxysilane[ClCH$_2$Si(OCH$_3$)$_3$],
chloromethyltriethoxysilane[ClCH$_2$Si(OCH$_2$CH$_3$)$_3$],
chloromethyltrimethoxygermane[ClCH$_2$Ge(OCH$_3$)$_3$],
chloromethyldimethylchlorosilane[ClCH$_2$Si(CH$_3$)$_2$Cl],
chloromethylmethyldichlorosilane[ClCH$_2$Si(CH$_3$)Cl$_2$],
chloromethylmethyldiethoxychlorosilane[ClCH$_2$Si(CH$_3$)(OCH$_2$CH$_3$)$_2$],
chloromethylmethyldiisopropoxysilane[ClCH$_2$Si(CH$_3$)(OCH(CH$_3$)$_2$)$_2$],
bis(chloromethyl)dichlorosilane[(ClCH$_2$)$_2$SiCl$_2$],
bis(chloromethyl) methylchlorosilane[(ClCH$_2$)$_2$SiCH$_3$Cl],
1-chloroethyltrichlorosilane[ClCHCH$_3$SiCl$_3$],
1,2-dichloroethyltrichlorosilane[CH$_2$ClCHClSiCl$_3$],
(dichloromethyl)trichlorosilane[CHCl$_2$SiCl$_3$],
(dichloromethyl)methyldichlorosilane[CHCl$_2$Si(CH$_3$)$_2$],
(dichloromethyl)dimethylchlorosilane[CHCl$_2$Si(CH$_3$)$_2$Cl],
2-chloroethyltrichlorosilane[Cl(CH$_2$)$_2$SiCl$_3$],
2-chloroethyltriethoxysilane[Cl(CH$_2$)$_2$Si(OCH$_2$CH$_3$)$_3$],
2-chloroethylmethyldichlorosilane[Cl(CH$_2$)$_2$SiCl$_2$CH$_3$],
2-chloroethylmethyldimethoxysilane[Cl(CH$_2$)$_2$Si(OCH$_3$)$_2$CH$_3$],
2-(chloromethyl)allyltrichlorosilane[CH$_2$=C(CH$_2$Cl)SiCl$_3$],
1-(chloromethyl)allyltrichlorosilane[CH(CH$_2$Cl)=CH$_2$SiCl$_3$],
3-chloropropyltrichlorosilane[Cl(CH$_2$)$_3$SiCl$_3$],
3-chloropropyltrichlorogermane[Cl(CH$_2$)$_3$GeCl$_3$],
3-chloropropyldimethylchlorosilane[Cl(CH$_2$)$_3$Si(CH$_3$)$_2$Cl],
3-chloropropyldimethylchlorogermane[Cl(CH$_2$)$_3$Ge(CH$_3$)$_2$Cl],
3-chloropropylmethyldichlorosilane[Cl(CH$_2$)$_3$Si(CH$_3$)Cl$_2$],
3-chloropropylphenyldichlorosilane[Cl(CH$_2$)$_3$SiPhCl$_2$],
3-chloropropyldimethylmethoxysilane[Cl(CH$_2$)$_3$Si(CH$_3$)$_2$(OCH$_3$)],
3-chloropropyltrimethoxysilane[Cl(CH$_2$)$_3$Si(OCH$_3$)$_3$],
3-chloropropyltriethoxysilane[Cl(CH$_2$)$_3$Si(OCH$_2$CH$_3$)$_3$],
3-chloropropylmethyldimethoxylsilane[Cl(CH$_2$)$_3$SiCH$_3$(OCH$_3$)$_2$],
3-chloropropylmethyldiethoxysilane[Cl(CH$_2$)$_3$SiCH$_3$(OCH$_2$CH$_3$)$_2$],
4-chlorobutyldimethylchlorosilane[Cl(CH$_2$)$_4$SiCl(CH$_3$)$_2$],
8-chlorooctyltrichlorosilane[Cl(CH$_2$)$_8$SiCl$_3$],
8-chlorooctyltrimethoxysilane[Cl(CH$_2$)$_8$Si(OCH$_3$)$_3$],
8-chlorooctyltriethoxysilane[Cl(CH$_2$)$_8$Si(OCH$_2$CH$_3$)$_3$],
p-iodophenyltrichlorosilane[p-IPhSiCl$_3$],
p-iodophenyltrimethoxysilane[p-IPhSi(OCH$_3$)$_3$],
(p-iodomethyl)phenyltrichlorosilane[p-ICH$_2$PhSiCl$_3$]
(p-iodomethyl)phenyltrimethoxysilane[p-ICH$_2$PhSi(OCH$_3$)$_3$],
iodomethyltrichlorosilane[ICH$_2$SiCl$_3$],
iodomethyltrimethoxysilane[ICH$_2$Si(OCH$_3$)$_3$],
iodomethyltriethoxysilane[ICH$_2$Si(OCH$_2$CH$_3$)$_3$],
3-iodopropyltrichlorosilane[I(CH$_2$)$_3$SiCl$_3$],
3-iodopropyltrimethoxysilane[I(CH$_2$)$_3$Si(OCH$_3$)$_3$], 3-iodopropyltriethoxysilane[I(CH$_2$)$_3$Si(OCH$_2$H$_3$)$_3$],
8-iodooctyltrichlorosilane[I(CH$_2$)$_8$SiCl$_3$],
8-iodooctyltrimethoxysilane[I(CH$_2$)$_8$Si(OCH$_3$)$_3$],
8-iodooctyltriethoxysilane[I(CH$_2$)$_8$Si(OCH$_2$CH$_3$)$_3$],
3-bromopropylthiol[Br(CH$_2$)$_3$SH],
8-bromooctylthiol[Br(CH$_2$)$_8$SH],
8-bromoundecylthiol[Br(CH$_2$)$_{11}$SH],
p-bromophenylthiol[p-BrPhSH],
o-bromophenylthiol[o-BrPhSH], m-bromophenylthiol[m-BrPhSH],
(p-bromomethyl)phenylthiol[p-BrCH$_2$PhSH],
3-chloropropylthiol[Cl(CH$_2$)$_3$SH],
8-chlorooctylthiol[Cl(CH$_2$)$_8$SH],
p-chlorophenylthiol[p-ClPhSH],
o-chlorophenylthiol[o-ClPhSiH],
m-chlorophenylthiol[m-ClPhSH],
(p-chloromethyl)phenylthiol[p-ClCH$_2$PhSH],
3-iodopropylthiol[I(CH$_2$)$_3$SH], 8-iodooctylthiol [I(CH$_2$)$_8$SH],
p-iodophenylthiol[p-IPhSiH], m-iodophenylthiol [m-IPhSH], and
(p-iodomethyl)phenylthiol[p-ICH$_2$PhSH].

In these formulas, "Ph" represents a phenyl group or a phenylene group. These compounds may be used alone or may be used in a combination of two or more of them.

Among these compounds, silane is the most preferable, because its synthesis is easy, it has a multiplicity of forms, it has a high reactivity and it produces a high bonding strength.

In the case where these compounds correspond to a compound having the formula (I), in the case where these compounds correspond to a compound having the formula (II) and R$^2$ and R$^1$ are the same as each other, or in the case where these compounds correspond to a compound having the formula (III) and R$^2$ and R$^3$ are the same as R$^1$, respectively, 3 Y$^1$s of the formula (I), 2 Y$^1$s and R$^2$ of the formula (II), and Y$^1$, R$^2$ and R$^3$ of the formula (III) react with a group such as a hydroxyl group on the surface of the aforementioned semiconducting material to form a covalent bond. Because of this bond, the bonding strength between the semiconducting material and the compound per each molecule thereof is strong.

Further, in the case where these compounds correspond to a compound having the formula (II) and R$^2$ is a saturated or unsaturated aliphatic hydrocarbon group having 1 to 20 carbon atoms, an aromatic hydrocarbon group or a heterocycle-containing group, or in the case where these compounds correspond to a compound having the formula (III) and R$^2$ and R$^3$ are each a saturated or unsaturated aliphatic hydrocarbon having 1 to 20 carbon atoms, an aromatic hydrocarbon group or a heterocycle-containing group, respectively, Y$^1$ and R$^2$ of the formula (II), and only Y$^1$ of the formula (III) reacts with a group such as a hydroxyl group on the surface of the aforementioned semiconducting material to form a covalent bond. Because of this bond, the number of bonds per molecule of the compound in relation to the semiconducting material can be reduced and therefore larger numbers of the compounds can be introduced into the surface of the semiconducting material.

Dyes

The dye to be used in the present invention can be any sensitizing dye having at least one functional group capable of reacting with a halogen atom. The dye is preferably at least one compound selected from compounds having, respectively, the following formulas (V) to (XII).

The dye is fixed to the surface of the aforementioned film.

Formula (V)

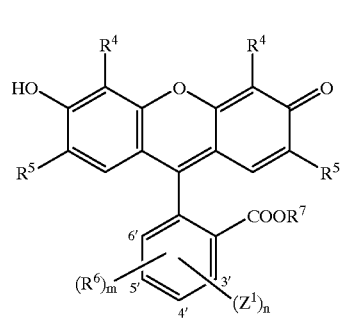

where R$^4$, R$^5$ and R$^6$ are selected from the group consisting of a hydrogen atom, a halogen atom, —NO$_2$, —OH, an alkyl group which may be substituted and has 1 to 10 carbon atoms and an aromatic hydrocarbon group which may be substituted; m is 1, 2, 3 or 4; R$^7$ is a hydrogen atom or an aliphatic hydrocarbon group having 1 to 10 carbon atoms; Z$^1$ is selected from the group consisting of a hydrogen atom, —NH$_2$, —NHR$^8$, —OH and —COOH; n is 0, 1 or 2; and R$^8$ is an aliphatic hydrocarbon group which may be substituted and has 1 to 4 carbon atoms.

Preferable examples of the compounds represented by the formula (V) are listed as compounds V-1 to V-31 in the following Table 1 and Table 2. R$^6$ in each of compounds V-6 and V-7 means 3'-Cl, 4'-Cl, 5'-Cl and 6'-Cl.

TABLE 1

| Compound No. | R$^4$ | R$^5$ | R$^6$ | R$^7$ | Z$^1$ |
|---|---|---|---|---|---|
| V-1 | H | H | H | H | H |
| V-2 | H | Br | H | H | H |
| V-3 | Br | NO$_2$ | H | H | H |
| V-4 | Br | Br | H | H | H |
| V-5 | I | I | H | H | H |
| V-6 | Br | Br | 3',4',5',6'-Cl$_4$ | H | — |
| V-7 | I | I | 3',4',5',6'-Cl$_4$ | H | — |
| V-8 | H | H | H | H | 4'-COOH |
| V-9 | H | H | H | H | 5'-COOH |
| V-10 | Br | Br | H | H | 4'-COOH |
| V-11 | Br | Br | H | H | 5'-COOH |
| V-12 | I | I | H | H | 4'-COOH |
| V-13 | I | I | H | H | 5'-COOH |
| V-14 | H | H | 4'-NO$_2$ | H | H |
| V-15 | H | H | 5'-NO$_2$ | H | H |
| V-16 | Br | Br | 4'-NO$_2$ | H | H |
| V-17 | Br | Br | 5'-NO$_2$ | H | H |
| V-18 | I | I | 4'-NO$_2$ | H | H |
| V-19 | I | I | 5'-NO$_2$ | H | H |
| V-20 | H | H | H | H | 4'-NH$_2$ |

TABLE 2

| Compound No. | R$^4$ | R$^5$ | R$^6$ | R$^7$ | Z |
|---|---|---|---|---|---|
| V-21 | H | H | H | H | 5'-NH$_2$ |
| V-22 | Br | Br | H | H | 4'-NH$_2$ |
| V-23 | Br | Br | H | H | 5'-NH$_2$ |
| V-24 | I | I | H | H | 4'-NH$_2$ |
| V-25 | I | I | H | H | 5'-NH$_2$ |
| V-26 | H | H | H | H | 4'-OH |
| V-27 | H | H | H | H | 5'-OH |
| V-28 | Br | Br | H | H | 4'-OH |
| V-29 | Br | Br | H | H | 5'-OH |
| V-30 | I | I | H | H | 4'-OH |
| V-31 | I | I | H | H | 5'-OH |

Formula (VI)

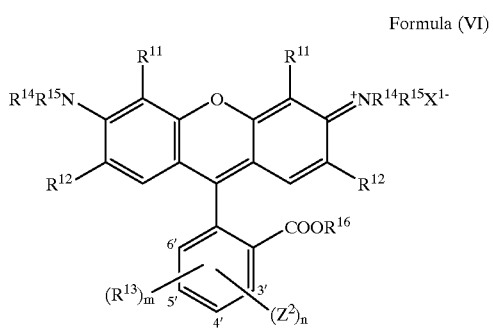

where $R^{11}$, $R^{12}$ and $R^{13}$ are selected from the group consisting of a hydrogen atom, a halogen atom, —$NO_2$, —OH, an alkyl group which may be substituted and has 1 to 10 carbon atoms and an aromatic hydrocarbon group which may be substituted; m is 1 or 2; $R^{14}$ and $R^1$ are selected from the group consisting of a hydrogen atom, an alkyl group which may be substituted and has 1 to 10 carbon atoms and an aromatic hydrocarbon group which may be substituted; $X^{1-}$ is a counter ion; $R^{16}$ is a hydrogen atom or an aliphatic hydrocarbon group having 1 to 10 carbon atoms; $Z^2$ is selected from the group consisting of a hydrogen atom, —$NH_2$, —$NHR^{17}$, —OH and —COOH; n is 0, or 2; and $R^{17}$ is analiphatic hydrocarbon group which may be substituted and has having 1 to 4 carbon atoms, with the proviso that $Z^2$ is selected from the group consisting of —$NH_2$, —$NHR^{17}$, —OH and —COOH and n is 1 or 2 if all of $R^{14}$, $R^{15}$ and $R^{16}$ are a group other than a hydrogen atom.

Preferable examples of the compounds represented by the formula (VI) are listed as compounds VI-1 to VI-12 in the following table 3.

TABLE 3

| Compound No. | $R^{11}$ | $R^{12}$ | $R^{13}$ | $R^{14}$ | $R^{15}$ | $R^{16}$ | $Z^2$ | $X^{1-}$ |
|---|---|---|---|---|---|---|---|---|
| VI-1 | H | H | H | H | H | H | H | $Cl^-$ |
| VI-2 | H | H | H | $CH_3$ | H | H | H | $ClO_4^-$ |
| VI-3 | H | H | H | $CH_3$ | $CH_3$ | H | H | $ClO_4^-$ |
| VI-4 | H | H | H | $C_2H_5$ | $C_2H_5$ | H | H | $Cl^-$ |
| VI-5 | H | $CH_3$ | H | $C_2H_5$ | H | H | H | $ClO_4^-$ |
| VI-6 | H | H | H | H | H | $CH_3$ | H | $Cl^-$ |
| VI-7 | H | H | H | $C_2H_5$ | H | $C_2H_5$ | H | $Cl^-$ |
| VI-8 | H | $CH_3$ | H | $C_2H_5$ | H | $C_2H_5$ | H | $ClO_4^-$ |
| VI-9 | H | H | H | $C_2H_5$ | $C_2H_5$ | H | 4'-COOH | $Cl^-$ |
| VI-10 | H | H | H | $C_2H_5$ | $C_2H_5$ | H | 5'-COOH | $Cl^-$ |
| VI-11 | H | H | H | $C_2H_5$ | $C_2H_5$ | H | 4'-$NH_2$ | $Cl^-$ |
| VI-12 | H | H | H | $C_2H_5$ | $C_2H_5$ | H | 5'-$NH_2$ | $Cl^-$ |

Formula (VII)

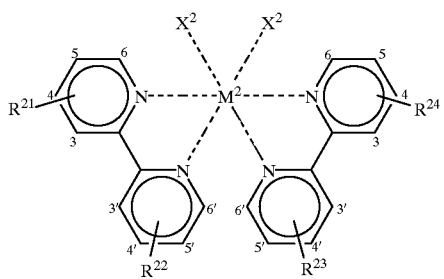

where $M^2$ is Fe, Ru or Os; $X^2$ is selected from the group consisting of a halogen atom, —OH, —CN and —SCN; $R^{21}$ to $R^{24}$ are selected from the group consisting of a hydrogen atom, a halogen atom, —$NO_2$, —COOH, —OH, —$NH_2$, —$NHR^{25}$, an aliphatic hydrocarbon group which may be substituted and has 1 to 10 carbon atoms, an aromatic hydrocarbon group which may be substituted and a heterocyclic group; $R^{25}$ is an aliphatic hydrocarbon group which may be substituted and has 1 to 4 carbon atoms or an aromatic hydrocarbon group; and at least one of $R^{21}$ to $R^{24}$ is selected from the group consisting of —COOH, —OH, —$NH_2$, —$NHR^{25}$ and a pyridyl group.

Preferable examples of the compounds represented by the formula (VII) are listed as compounds VII-1 to VII-13 in the following Table 4.

TABLE 4

| Compound No. | $R^{21}$,$R^{24}$ | $R^{22}$,$R^{23}$ | $M^2$ | $X^2$ |
|---|---|---|---|---|
| VII-1 | 4'-COOH | 4-COOH | Fe | Cl |
| VII-2 | 4'-COOH | 4-COOH | Fe | OH |
| VII-3 | 4'-COOH | 4-COOH | Ru | Cl |
| VII-4 | 5'-COOH | 5-COOH | Ru | Br |
| VII-5 | 4'-COOH | 4-COOH | Ru | OH |
| VII-6 | 4'-COOH | 4-COOH | Ru | CN |
| VII-7 | 4'-COOH | 4-COOH | Ru | SCN |
| VII-8 | 4'-$CH_3$ | 4-COOH | Ru | SCN |
| VII-9 | H | 4-(4"-$C_5H_4N$) | Ru | SCN |
| VII-10 | 4'-(4'-$C_5H_4N$) | 4-(4"-$C_5H_4N$) | Ru | SCN |
| VII-12 | 4'-COOH | 4-COOH | Os | Cl |
| VII-13 | 4'-COOH | 4-COOH | Os | SCN |

Formula (VIII)

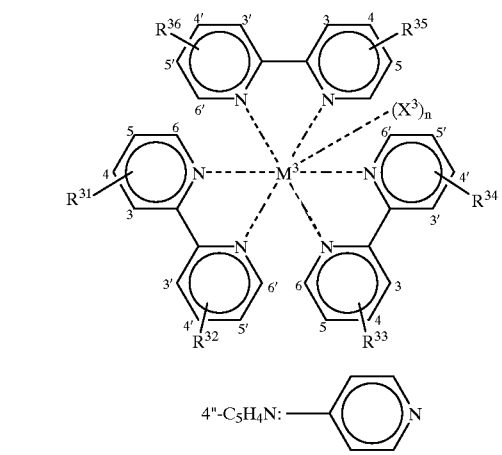

where $M^3$ is Fe, Ru or Os; $X^3$ is selected from the group consisting of a halogen atom, —$SO_4$, —$ClO_4$, —OH, —CN and —SCN; n is 0, 1 or 2; $R^{31}$ to $R^{36}$ are selected from the group consisting of a hydrogen atom, a halogen atom, —$NO_2$, —COOH, —OH, —$NH_2$, —$NHR^8$, an aliphatic hydrocarbon group having 1 to 10 carbon atoms, an aromatic hydrocarbon group and a heterocyclic group; $R^{37}$ is an aliphatic hydrocarbon group which may be substituted and has 1 to 4 carbon atoms or an aromatic hydrocarbon group; and at least one of $R^{31}$ to $R^{36}$ is selected from the group consisting of —COOH, —OH, —$NH_2$, —$NHR^{37}$ and a pyridyl group.

Preferable examples of the compounds represented by the formula (VIII) are listed as compounds VIII-1 to VIII-11 in the following Table 5.

TABLE 5

| Compound No. | $R^{31}$ | $R^{32}$ | $R^{33}$ | $R^{34}$ | $R^{35}$ | $R^{36}$ | $M^3$ | $(X^3)_n$ |
|---|---|---|---|---|---|---|---|---|
| VIII-1 | 4-COOH | 4'-COOH | H | H | H | H | Fe | $Cl_2$ |
| VIII-2 | 4-COOH | 4'-COOH | 4-COOH | 4'-COOH | H | H | Fe | $Cl_2$ |
| VIII-3 | 3-COOH | 3'-COOH | 3-COOH | 3'-COOH | 3-COOH | 3'-COOH | Ru | $Cl_2$ |
| VIII-4 | 4-COOH | 4'-COOH | 4-COOH | 4'-COOH | 4-COOH | 4'-COOH | Ru | $(ClO_4)_2$ |
| VIII-5 | 4-COOH | 4'-COOH | H | H | H | H | Ru | $Cl_2$ |
| VIII-6 | 4-COOH | 4'-COOH | 4-COOH | 4'-COOH | H | H | Ru | $SO_4$ |
| VIII-7 | 4-COOH | 4'-COOH | 4-COOH | 4'-COOH | 4-$CH_3$ | 4"-$CH_3$ | Ru | $Cl_2$ |
| VIII-8 | 4-COOH | 4'-COOH | 4-$CH_3$ | 4'-$CH_3$ | 4-$CH_3$ | 4"-$CH_3$ | Ru | $(ClO_4)_2$ |
| VIII-9 | 4-(4"-$C_5H_4N$) | 4-(4"-$C_5H_4N$) | H | H | H | H | Ru | $Cl_2$ |
| VIII-10 | 4-COOH | 4-COOH | H | H | H | H | Os | $Cl_2$ |
| VIII-11 | 4-COOH | 4-COOH | 4-COOH | 4'-COOH | 4-COOH | 4'-COOH | Os | $Cl_2$ |

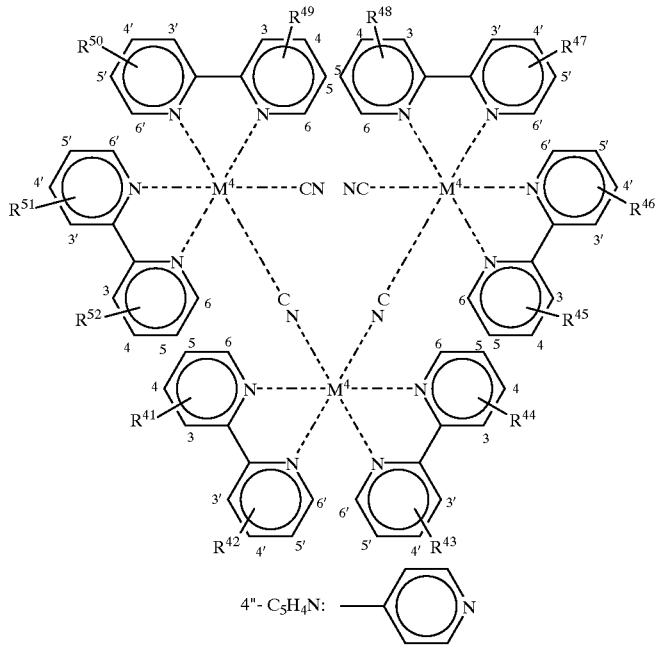

Formula (IX)

where $M^4$ is Fe, Ru or Os; $R^{41}$ to $R^{51}$ are selected from the group consisting of a hydrogen atom, a halogen atom, —$NO_2$, —COOH, —OH, —$NH_2$, —$NHR^{53}$, an aliphatic hydrocarbon group having 1 to 10 carbon atoms, an aromatic hydrocarbon group and a heterocyclic group; $R^{53}$ is an aliphatic group which may be substituted and has 1 to 4 carbon atoms or an aromatic hydrocarbon group; and at least one of $R^{41}$ to $R^{51}$ is selected from the group consisting of —COOH, —OH, —$NH_2$, —$NHR^{53}$ and a pyridyl group.

Preferable examples of the compounds represented by the formula (IX) are listed as compounds IX-1 to IX-4 in the following Table 6.

TABLE 6

| Compound No. | $R^{41},R^{44}$ | $R^{42},R^{43}$ | $R^{45},R^{48},$ $R^{49},R^{52}$ | $R^{46},R^{47},$ $R^{50},R^{51}$ | $M^4$ |
|---|---|---|---|---|---|
| IX-1 | 4-COOH | 4'-COOH | H | H | Ru |
| IX-2 | 4-COOH | 4'-COOH | 4-$CH_3$ | 4'-$CH_3$ | Ru |
| IX-3 | 4-COOH | 4'-COOH | 4-COOH | 4'-COOH | Ru |
| IX-4 | 4-(4"-$C_5H_4N$) | 4'-(4"-$C_5H_4N$) | H | H | Ru |

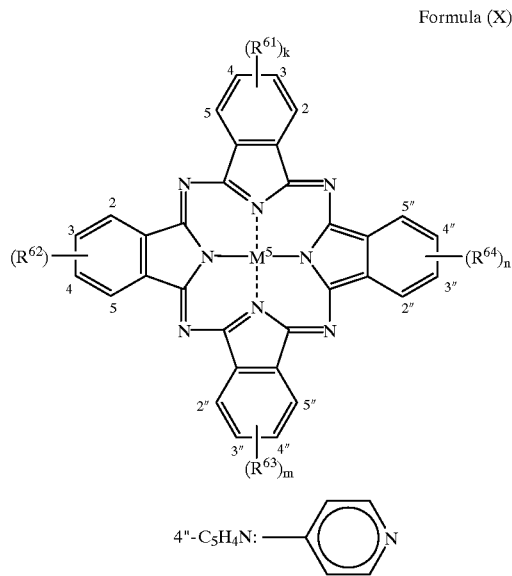

Formula (X)

4"-C₅H₄N: 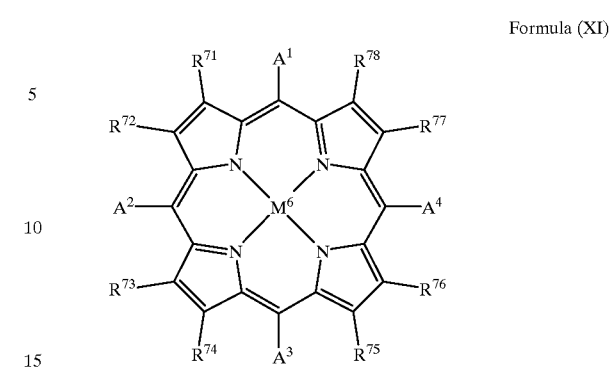

Formula (XI)

where $M^5$ is selected from the group consisting of $(H)_2$, Mg, TiO, VO, Mn, Fe, Co, Ni, Cu, Zn, GaOH, GaCl, InOH, InCl and SnO; $R^{61}$ to $R^{64}$ are selected from the group consisting of a hydrogen atom, a halogen atom, $-NO_2$, $-NH_2$, $-NHR$, $-OH$, $-COOH$, an aliphatic hydrocarbon group which may be substituted and has 1 to 10 carbon atoms, an aromatic hydrocarbon group which may be substituted and a heterocyclic group; at least one of $R^{61}$ to $R^{64}$ is selected from the group consisting of $-NH_2$, $-NHR^{51}$, $-OH$ and $-COOH$; $R^{65}$ is analiphatic group which may be substituted and has 1 to 4 carbon atoms or an aromatic hydrocarbon group; and k, l, m and n are each 1 or 2.

Preferable examples of the compounds represented by the formula (X) are listed as compounds X-1 to X-15 in the following Table 7.

where $M^4$ is selected from the group consisting of $(H)_2$, Mg, Zn, Ni, Co, Cu and Pd; $R^{71}$ to $R^{78}$ are selected from the group consisting of a hydrogen atom, a halogen atom, a hydroxyl group, an alkoxy group which may be substituted and has 1 to 4 carbon atoms, an aliphatic hydrocarbon group which may be substituted and has 1 to 10 carbon atoms and an aromatic hydrocarbon group which may be substituted; $A^1$ to $A^4$ are each an aromatic hydrocarbon group which may be substituted or a heterocyclic group; at least one of $A^1$ to $A^4$ is a phenyl group substituted with a group selected from the group consisting of $-NH_2$, $-NHR^{79}$, $-OH$ and $-COOH$ or a pyridyl group; and $R^{79}$ is an aliphatic group which may be substituted and has 1 to 4 carbon atoms or an aromatic hydrocarbon group.

Preferable examples of the compounds represented by the formula (XI) are listed as compounds XI-1 to XI-6 in the following Table 8.

TABLE 7

| Compound No. | $R^{61}$ | $R^{62}$ | $R^{63}$ | $R^{64}$ | $M^5$ |
|---|---|---|---|---|---|
| X-1 | 4-$NH_2$ | 4'-$NH_2$ | 4"-$NH_2$ | 4'''-$NH_2$ | $H_2$ |
| X-2 | 4-$NH_2$ | 4'-$NH_2$ | 4"-$NH_2$ | 4'''-$NH_2$ | Fe |
| X-3 | 4-$NH_2$ | 4'-$NH_2$ | 4"-$NH_2$ | 4'''-$NH_2$ | Co |
| X-4 | 4-$NH_2$ | 4'-$NH_2$ | 4"-$NH_2$ | 4'''-$NH_2$ | Ni |
| X-5 | 4-$NH_2$ | 4'-$NH_2$ | 4"-$NH_2$ | 4'''-$NH_2$ | Cu |
| X-6 | 4-$NH_2$ | 4'-$NH_2$ | 4"-$NH_2$ | 4'''-$NH_2$ | VO |
| X-7 | 4-COOH | 4'-COOH | 4"-COOH | 4'''-COOH | $H_2$ |
| X-8 | 4-COOH | 4'-COOH | 4"-COOH | 4'''-COOH | Fe |
| X-9 | 4-COOH | 4'-COOH | 4"-COOH | 4'''-COOH | Co |
| X-10 | 4-COOH | 4'-COOH | 4"-COOH | 4'''-COOH | Ni |
| X-11 | 4-COOH | 4'-COOH | 4"-COOH | 4'''-COOH | VO |
| X-12 | 4-COOH | 4'-COOH | 4"-COOH | 4'''-COOH | TiO |
| X-13 | 4-COOH | 4'-COOH | 4"-COOH | 4'''-COOH | GaOH |
| X-14 | 3,4-$(COCH)_2$ | 3',4'-$(COOH)_2$ | 3",4"-$(COOH)_2$ | 3''',4'''-$(COOH)_2$ | Co |
| X-15 | 3,4-$(COOH)_2$ | 3',4'-$(COOH)_2$ | 3",4"-$(COOH)_2$ | 3''',4'''-$(COOH)_2$ | Cu |

TABLE 8

| Compound No. | R71~R78 | A1~A4 | M4 |
|---|---|---|---|
| XI-1 | H | —C6H4—COOH | H2 |
| XI-2 | H | —C6H4—COOH | Cu |
| XI-3 | H | —C6H4—COOH | Co |
| XI-4 | H | —C6H4—COOH | Ni |
| XI-5 | H | —C6H4—NH2 | H2 |
| XI-6 | H | —(4-pyridyl) | H2 |

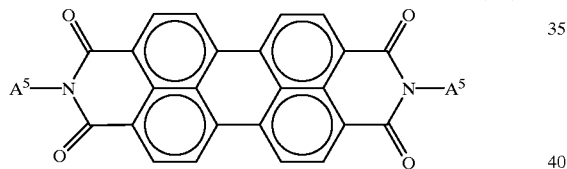

Formula (XII)

where $A^5$ is an aliphatic hydrocarbon group substituted with a group selected from the group consisting of —NH$_2$, —NHR$^{81}$, —OH, —COOH and a pyridyl group, an aromatic hydrocarbon group substituted with a group selected from the group consisting of —NH$_2$, —NHR$^{81}$, —OH, —COOH and a pyridyl group, or a pyridyl group; and $R^{81}$ is an aliphatic hydrocarbon group which may be substituted and has 1 to 4 carbon atoms or an aromatic hydrocarbon group.

Preferable examples of the compounds represented by the formula (XII) are listed as compounds XII-1 to XII-19 in the following Table.

TABLE 9

| Compound No. | A5 |
|---|---|
| XII-1 | —CH2—COOH |
| XII-2 | —(CH2)2—COOH |
| XII-3 | —CH(CH3)—COOH |

TABLE 9-continued

| Compound No. | A5 |
|---|---|
| XII-4 | —C6H10(H)—COOH (cyclohexyl) |
| XII-5 | —CH2—C6H4—COOH |
| XII-6 | —(CH2)2—NH2 |
| XII-7 | —(CH2)3—NH2 |
| XII-8 | —(CH2)6—NH2 |
| XII-9 | —(CH2)12—NH2 |
| XII-10 | —C6H10(H)—NH2 (cyclohexyl) |
| XII-11 | —C6H10(H)—NH2 (cyclohexyl, other position) |
| XII-12 | —CH2—C6H4—CH2—NH2 |
| XII-13 | —C6H4—NH2 |
| XII-14 | —C6H4—NH2 (meta) |
| XII-15 | —(CH2)2—OH |
| XII-16 | —C6H4—CH2OH |
| XII-17 | —(4-pyridyl) |
| XII-18 | —CH2—(4-pyridyl) |
| XII-19 | —(3-pyridyl) |

Preparation of Photo-Semiconducting Electrodes

For the purpose of forming a film from at least one compound selected from the compounds represented by the formulas (I) to (IV) on the surface of the semiconducting material, an appropriate method such as the following liquid-phase adsorption method can be employed.

The liquid-phase adsorption method comprises the steps of immersing the semiconducting material in a dilute solution containing at least one compound selected from the compounds represented by the formulas (I) to (IV) so that the surface of the semiconductor reacts with $Y^1$ or the thiol group of at least one compound selected from the compounds represented by the formulas (I) to (IV), taking out the semiconducting material after the reaction, rinsing it and drying it.

Examples of the solvent, which is used to dissolve at least one compound selected from the compounds represented by the formulas (I) to (IV), include hydrocarbons, such as toluene, hexane and hexadecane, esters, such as ethyl acetate, ethers, such as diethyl ether and tetrahydrofuran, halogenated hydrocarbons, such as dichloromethane and 1,1,2-trichloroethane, ketones, such as acetone and cyclohexanone, alcohol, such as ethanol and 1-butanol, and mixtures thereof. Among these solvents, preferable are those solvents which do not react with any of the compounds represented by the formulas (I) to (IV), and these are hydrocarbons, ethers and halogenated hydrocarbons. Particularly preferable solvents are hydrocarbons such as toluene, hexane and hexadecane.

In the above-mentioned dilute solution, the concentration of the compounds represented by the formulas (I) to (IV) is normally in the range of $1.0 \times 10^{-4}$ to 1.0 mol/l, and most preferably in the range of $1.0 \times 10^{-4}$ to $1.0 \times 10^{-2}$ mol/l.

Although the reaction may be carried out at room temperature, the reaction may also be carried out at an elevated temperature below the boiling point, or an appropriate catalyst may be added to the reaction in order to promote the reaction.

In the above-mentioned liquid-phase adsorption, the surface of the semiconducting material reacts with $Y^1$ or the thiol group of at least one compound selected from the compounds represented by the formulas (I) to (IV) so that these are chemically combined. As a result, a chemically adsorbed film (a chemically adsorbed monomolecular or built-up film) is formed on the surface of the semiconducting material. After the chemically adsorbed film is formed, excess adherent molecules other than the film are washed out and removed from the semiconducting material.

If the liquid-phase adsorption method is implemented for the preparation of a modified electrode by using titanium oxide as a semiconducting material and 3-bromopropyltrichlorosilane as at least one compound selected from the compounds represented by the formulas (I) to (IV), the titanium oxide as a semiconducting material is immersed in a solution containing 3-bromopropyltrichlorosilane. As a result, a chemical reaction as illustrated in FIG. 1 occurs, wherein the 3-bromopropyltrichlorosilane is chemically combined with the surface of the titanium oxide as a semiconducting material so that the aforementioned chemically adsorbed film comprising 3-bromopropyltrichlorosilane is formed.

If the reaction for the formation of the chemically adsorbed film proceeds slowly, a catalyst such as an acid or an alkali may be added or otherwise the reaction system may be heated. It is also effective to introduce an active layer into the surface of the titaniumoxide by subjecting the surface of the titanium oxide to a pretreatment such as a heat treatment, an acid treatment, a plasma treatment, a hot-water treatment and an ozone treatment.

The thus formed chemically adsorbed film is caused to react with a dye so that the dye is combined with the film. For this purpose, an appropriate method can be adopted. Some illustrative examples are given below.

Figure 2:
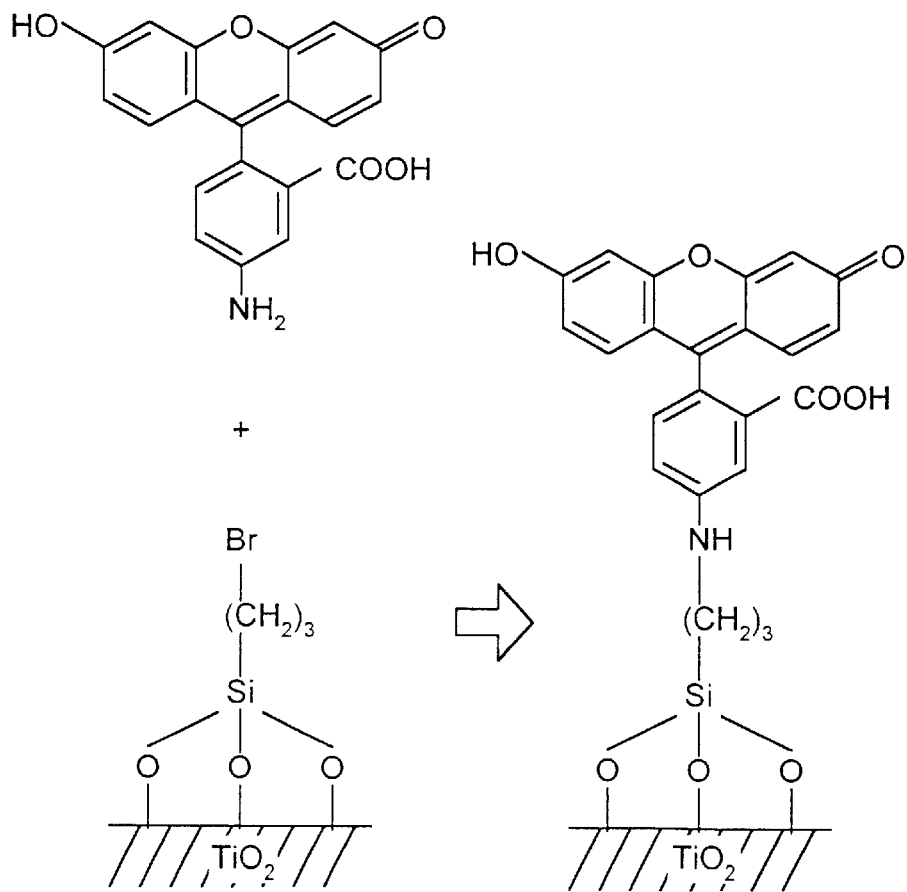
FIG. 2 is an enlarged conceptual diagram illustrating an example of the state where a dye is fixed to the surface of a semiconducting via a chemically adsorbed film.

According to the first method, titanium oxide having the chemically adsorbed film formed on the surface thereof is immersed in a solution containing a dye which has a carboxyl group as a functional group capable of reacting with the halogen atom. In this way, the chemically adsorbed film is allowed to react with the carboxyl group of the dye, wherein a reaction as illustrated in FIG. 2 occurs so that the dye is combined with and fixed to the surface of the chemically adsorbed film. As a result, the dye is fixed to the surface of the surface of titanium oxide as a semiconducting material via the chemically adsorbed film.

Figure 3:
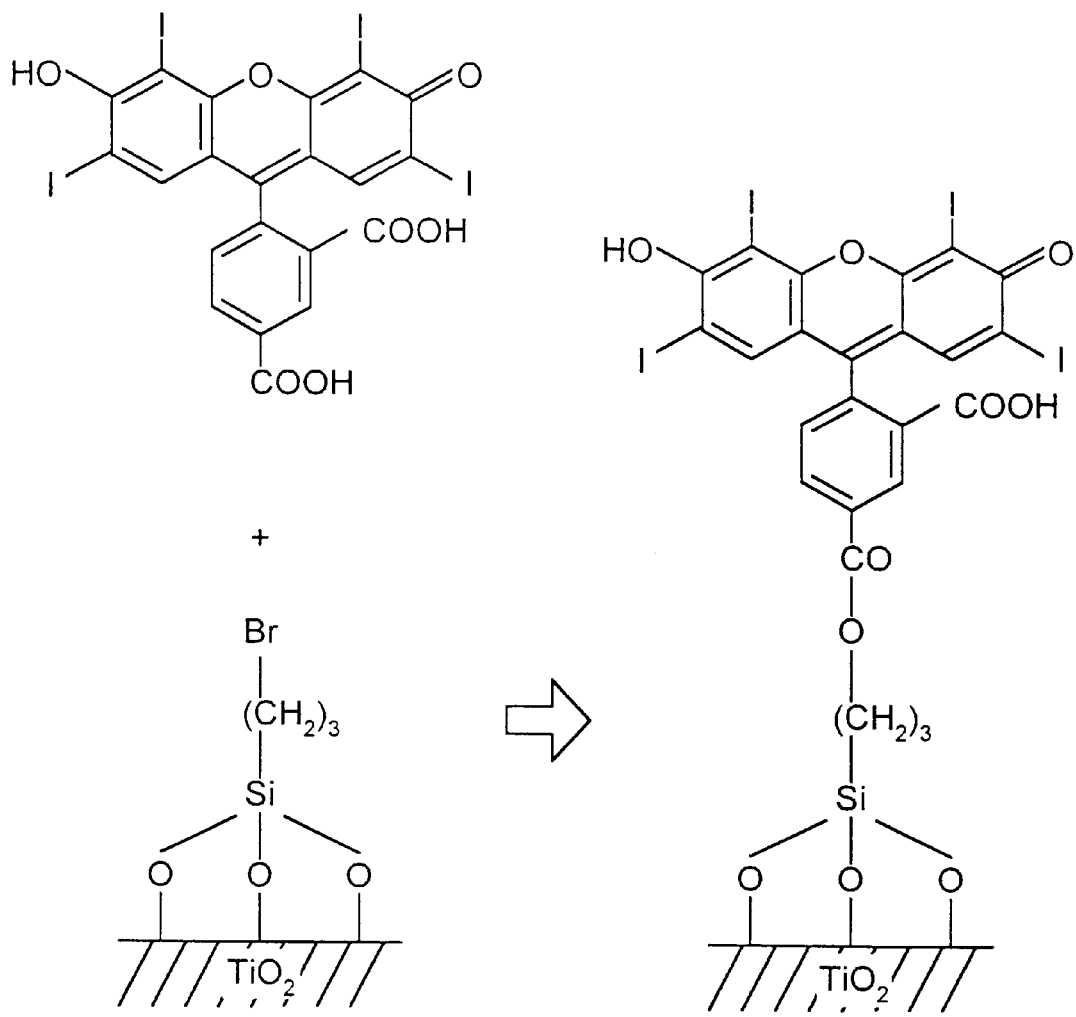
FIG. 3 is an enlarged conceptual diagram illustrating an example of the state where a dye is fixed to the surface of a semiconducting material via a chemically adsorbed film.

According to the second method, titanium oxide having the chemically adsorbed film formed on the surface thereof is immersed in a solution containing a dye which has a primary amine as a functional group capable of reacting with the halogen atom. In this way, the chemically adsorbed film is allowed to react with the primary amino group of the dye, wherein a reaction as illustrated in FIG. 3 occurs so that the dye is combined with and fixed to the surface of the chemically adsorbed film. As a result, the dye is fixed to the surface of the surface of titanium oxide as a semiconducting material via the chemically adsorbed film.

Examples of the solvent, which is used to dissolve the dye, include hydrocarbons, such as toluene, hexane and hexadecane, esters, such as ethyl acetate, ethers, such as diethyl ether and tetrahydrofuran, halogenated hydrocarbons, such as dichloromethane and 1,1,2-trichloroethane, ketones, such as acetone and cyclohexanone, alcohol, such as ethanol and 1-butanol, amides, such as N,N-dimethylformamide and N-methylpyrrolidone, and mixtures thereof. Among these solvents, preferable are those solvents which have a sufficient solubility to the compounds represented by the formulas (V) to (XII) and which react neither with the chemically adsorbed film produced nor with any of the compounds represented by the formulas (I) to (IV). Particularly preferable solvents are hydrocarbons such as toluene, ethers such as tetrahydrofuran, halogenated hydrocarbons such as dichloromethane, and polar aprotic solvents such as N,N-dimethylformamide.

The thus obtained photo-semiconducting electrode is characterized in that it is capable of efficiently absorbing solar light and performing energy conversion and it is superior in photoelectric conversion efficiency, stability and durability and can be easily produced, and further in that it is suitable for use in a photoelectric conversion method and in a photoelectric converting device which are described later.

Photoelectric Converting Device and Photoelectric Conversion Method

According to the photoelectric conversion method of the present invention, a photoelectric conversion reaction is caused by irradiating light onto a pair of electrodes connected to each other such that an electric current may flow therebetween and placed in an electrolyte solution, wherein at least one of the pair of electrodes is the photo-semiconductor electrode of the present invention and the other electrode is a counter electrode. The photoelectric conversion method of the present invention can be suitably implemented by using the photoelectric converting device of the present invention.

The photoelectric converting device comprises a pair of electrodes placed in an electrolyte solution and a connecting means which enables an electric current to flow between the pair of electrodes, wherein at least one of the pair of electrodes is the photo-semiconductor electrode of the present invention and the other electrode is a counter electrode.

Counter Electrode

A counter electrode which forms a pair with the photo-semiconductor electrode (hereinafter referred to as "modified electrode"on occasion) is not particularly limited in terms of its material, shape, structure and size, as long as it is stable and resists oxidation and reduction. For example, the counter electrode can be selected from a planar material such as palladium or graphite and a transparent electrode such as ITO glass or Nesa glass.

Connecting Means Which Enable an Electric Current to Flow Between the Pair of Electrodes A connecting means, which enables an electric current to flow between the photo-semiconductor electrode (modified electrode) and the counter electrode, is not particularly limited, and it can be appropriately selected depending on purposes. For example, the connecting means may be a known lead wire, or it may be a wire, a plate, a printed film or a vacuum-deposited film made from an electro conductive material such as a metal, carbon or a metal oxide.

Electrolyte Solution

The electrolyte solution is not particularly limited, and it can be appropriately selected. Examples of the electrolyte solution include an aqueous solution or a solution in a nonaqueous solvent, such as alcohol or propylene carbonate, of a salt such as sodium sulfate, potassium chloride, lithium chloride or tetraethylammonium perchlorate, an alkali such as sodium hydroxide or potassium carbonate, an acid such as sulfuric acid or hydrochloric acid, or a mixture of the foregoing substances.

Further, in order to stabilize the photocurrent characteristics, the electrolyte solution may contain an appropriate amount of a substance, such as potassium iodide or p-benzoquinone, which is reversibly oxidized and reduced.

Photoelectric Conversion Reaction

In the photoelectric converting device and the photoelectric conversion method of the present invention, a photoelectric conversion reaction can be induced in the following way.

The above-mentioned pair of electrodes, that is, the photo-semiconductor electrode (modified electrode) and the counter electrode, are immersed in the electrolyte solution. Next, the semiconductor electrode is irradiated with monochromatic light of a wavelength ranging from a 300–400 nm ultraviolet region to a region corresponding to the absorption wavelength of the dye fixed to the semiconductor electrode, or with polychromatic light including any of the foregoing regions, or with light ranging from white light such as solar light to polychromatic light. As a result, the radiant energy of light is converted into electrical energy, and, simultaneously, hydrogen is generated on the surface of an electrode serving as a cathode while oxygen is generated on the surface of an electrode serving as an anode.

In the present invention, because of the use of the specific pair of electrodes described above, ultraviolet light in solar light and also the light ranging from visible light to near-infrared light are efficiently utilized in the photoelectric conversion reaction wherein the light energy is converted into chemical energy or electrical energy. As a result, the present invention makes it possible to utilize light in general such as solar light. Therefore, the energy of light such as solar light can be effectively utilized at a high efficiency. In addition, the characteristics of the photo-semiconductor electrode (modified electrode) can be maintained in a stable manner for a long period of time and the photoelectric conversion reaction can always be performed efficiently, because the dye is tightly adhered to the surface of the photo-semiconductor electrode (modified electrode) of the present invention by a covalent bond and the dye is not easily removed from the photo-semiconductor electrode (modified electrode).

EXAMPLES

The following examples are given by way of illustration and not by way of limitation of the present invention.

Example 1

Preparation of a Colloidal Solution of Titanium Oxide 25 ml of tetra-isopropyl orthotitanate was gradually added to a mixture of 150 ml of deionized and thereafter distilled water and 1.54 g of concentrated nitric acid (specific gravity: 1.38) with vigorous stirring. With continuous stirring, the reaction mixture was heated to 80° C., and maintained at that temperature for 8 hours while being stirred. These operations were all performed under a dry nitrogen stream. As a result, a milky stabilized colloidal solution of titanium oxide was obtained. The colloidal solution obtained was concentrated by means of a rotary evaporator to 40 ml of a viscous liquid by applying a vacuum of 30 mm Hg at 30° C.

Preparation of a Photo-Semiconductor Electrode (Modified Electrode))

The colloidal solution of titanium oxide was spin-coated on an ITO glass substrate, and the coating was sintered at 500° C. for 1 hour. The thickness of the semiconducting film of titaniumoxide on the ITO glass was about 0.3 $\mu$m. The structure of the semiconducting film obtained was examined by X-ray diffraction and found to be a mixture of anatase and rutile. By the procedure described above, an ITO/titanium oxide composite material was obtained, and the composite material was used as a substrate.

The ITO/titanium oxide composite material was immersed for 2 hours in a solution containing 3-bromopropyltrichlorosilane at a concentration of $10^{-3}$ mol/l in an n-hexadecane/carbon tetrachloride (4/1 by volume) solvent mixture. Then, the ITO/titanium oxide composite material was taken out of the solution and s sufficiently rinsed with n-hexadecane and acetone. After being dried at room temperature in a nitrogen atmosphere for 30 minutes, the ITO/titanium oxide composite material was further kept at 80° C. for 30 minutes.

Figure 4:
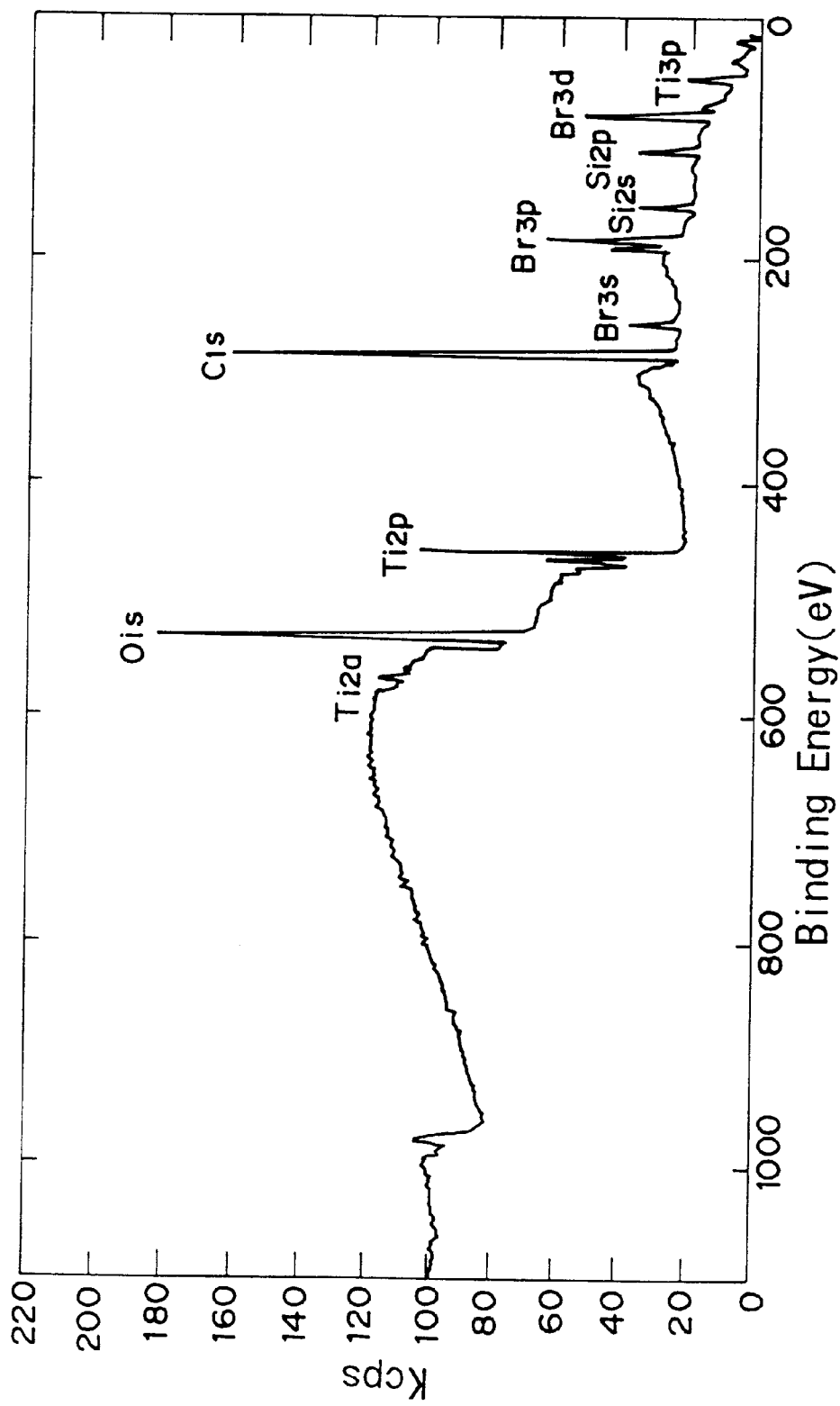
FIG. 4 shows the X-ray photoelectron spectrum of the surface of a semiconducting material obtained by linking 3-bromopropyltrichlorosilane to the surface of an ITO/titanium oxide composite material as a semiconducting material.

After being treated as described above, the surface of the ITO/titanium oxide composite material was observed under an X-ray photoelectron spectrometer (ESCALAB-220i manufactured by VG Inc.). FIG. 4 shows the X-ray photoelectron spectrum.

In the data shown in FIG. 4, signals of 3d, 3p and 3s of the Br atom were observed at about 70 eV, 180 eV and 256 eV, respectively, which confirmed that 3-bromopropyltrichlorosilane was bonded to the titania film formed on the surface of the ITO/titanium oxide composite material.

The ITO/titanium oxide composite material having the 3-bromopropyltrichlorosilane bonded to the surface thereof was immersed in a solution of 4-carboxy-2',4',5',7'-tetraiodofluorescein (the aforementioned compound V-8) in dimethylformamide (at a concentration of $5\times10^{-4}$ mol/l) at 90° C. for 24 hours so that a reaction occurred. After the reaction, ITO/titanium oxide composite material having the 3-bromopropyltrichlorosilane bonded to the surface thereof was sufficiently rinsed with ethanol and acetone. Then, the ITO/titanium oxide composite material was dried at room temperature in a nitrogen atmosphere for 30 minutes. In the procedure described above, the photo-semiconductor electrode (modified electrode) of Example 1 was prepared.

Figure 5:
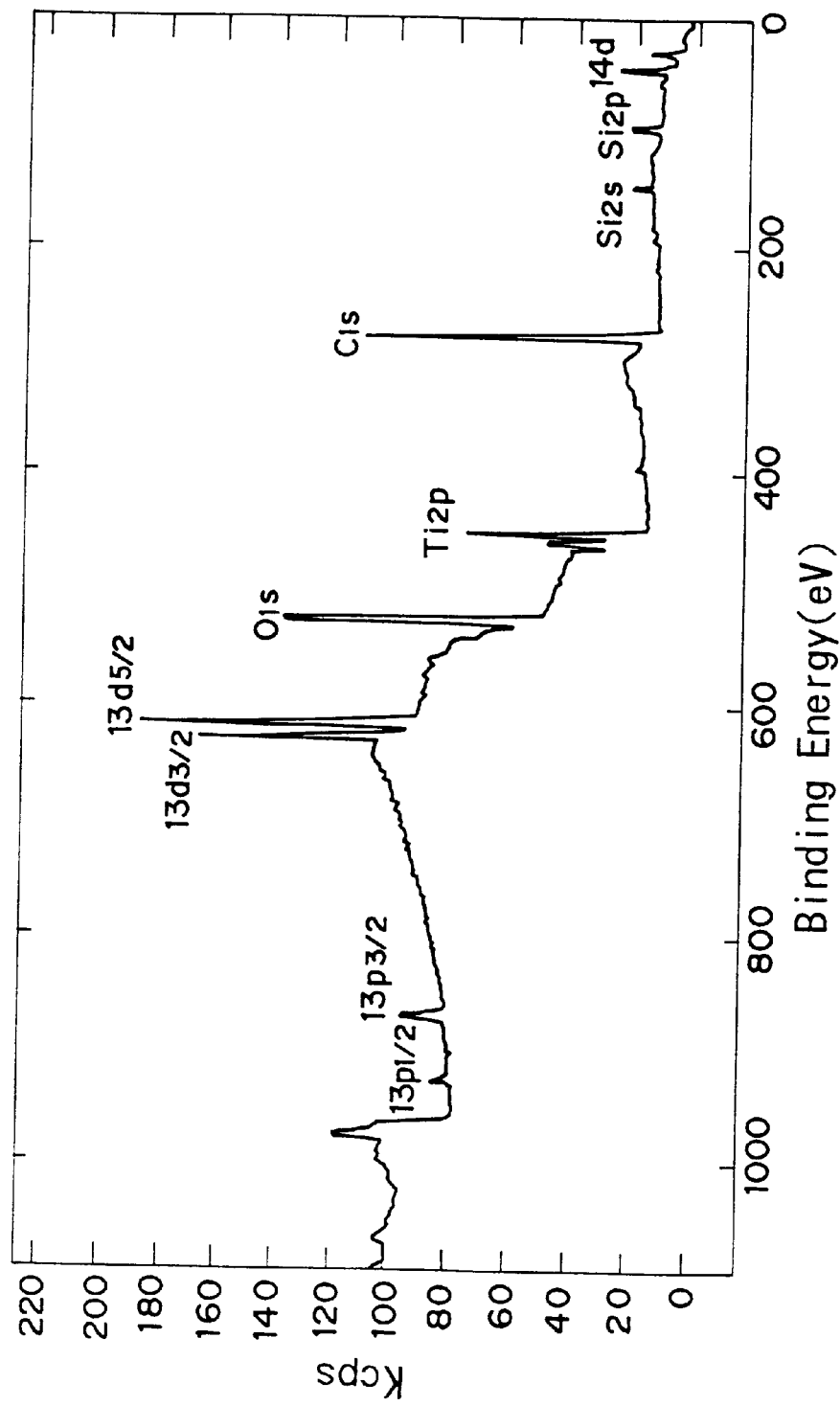
FIG. 5 shows the X-ray photoelectron spectrum of the surface of a semiconducting material obtained by further linking 4-carboxy-2',4',5',7'-tetraiodofluorescein to the surface of an ITO/titanium oxide composite material as a semiconducting material whose surface has 3-bromopropyltrichlorosilane already linked thereto.

The thus obtained photo-semiconducting electrode (modified electrode) was pinkish and transparent. The surface of the photo-semiconductor electrode (modified electrode) was observed by X-ray photoelectron spectrometry. FIG. 5 shows the X-ray photoelectron spectrum.

As in the data shown in FIG. 5, the intensities of the signals of the Br atom observed at about 70 eV, 180 eV and 256 eV diminished. Instead, signals of 3p1/2, 3p3/2, 3p5/2 and 4d of I atom of the 4-carboxy-2',4',5',7'-tetraiodofluorescein were observed at about 930 eV, 874 eV, 630 eV, 620 eV and 50 eV, respectively.

The UV-visible light absorption spectrum of the photo-semiconductor electrode (modified electrode) which was obtained was found to be approximately the same as that of the solution of 4-carboxy-2',4',5',7'-tetraiodofluorescein in ethanol.

Figure 6:
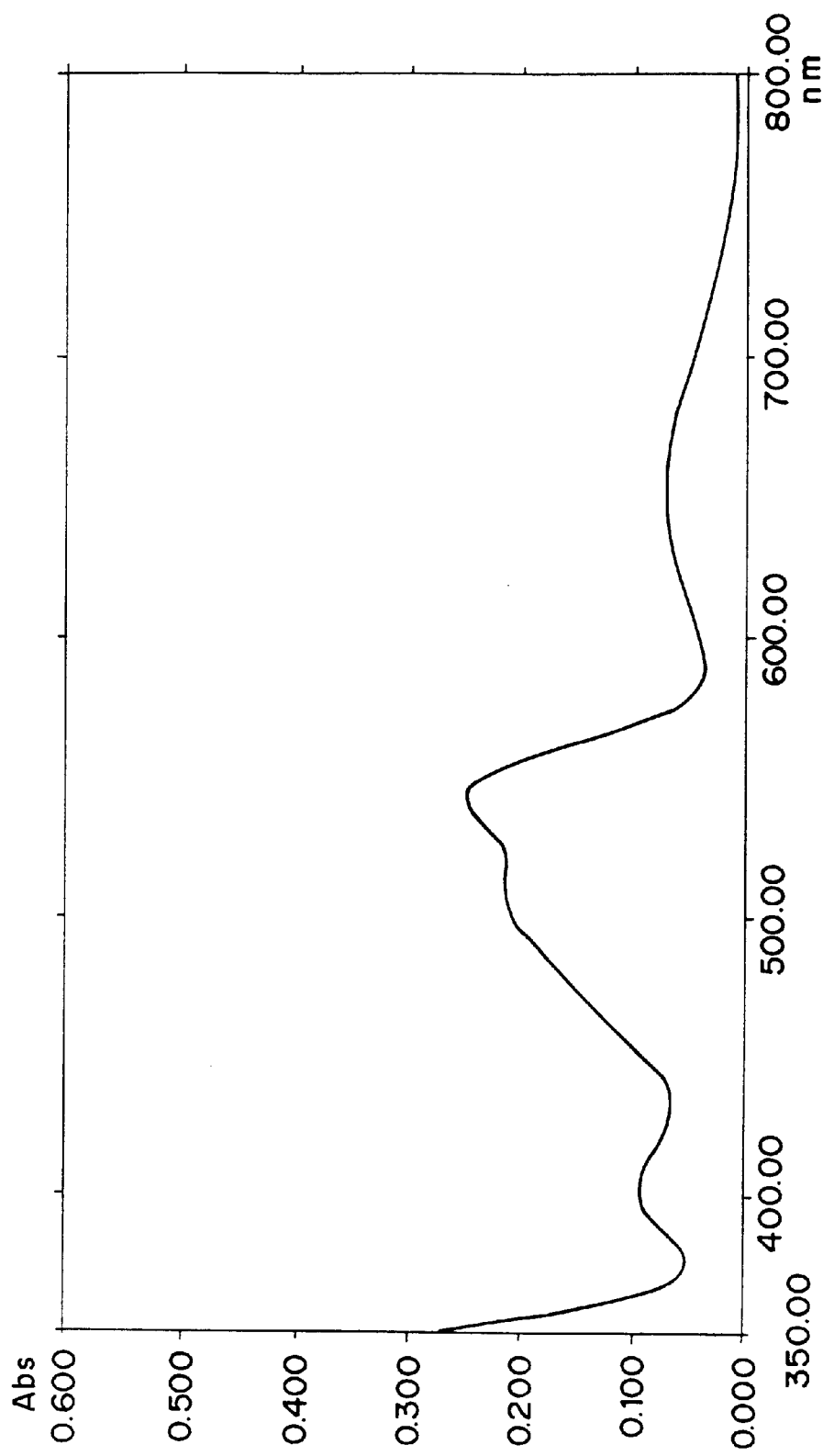
FIG. 6 shows the UV-visible light absorption spectrum of the modified electrode of Example 1.

FIG. 6 shows the UV-visible light absorption spectrum obtained. The data of FIG. 6 confirmed that the 2',4',2',4',5',7'-tetraiodofluorescein was fixed to the titanium oxide layer via the chemically adsorbed film comprising 3-bromopropyltrichlorosilane.

Figure 7:
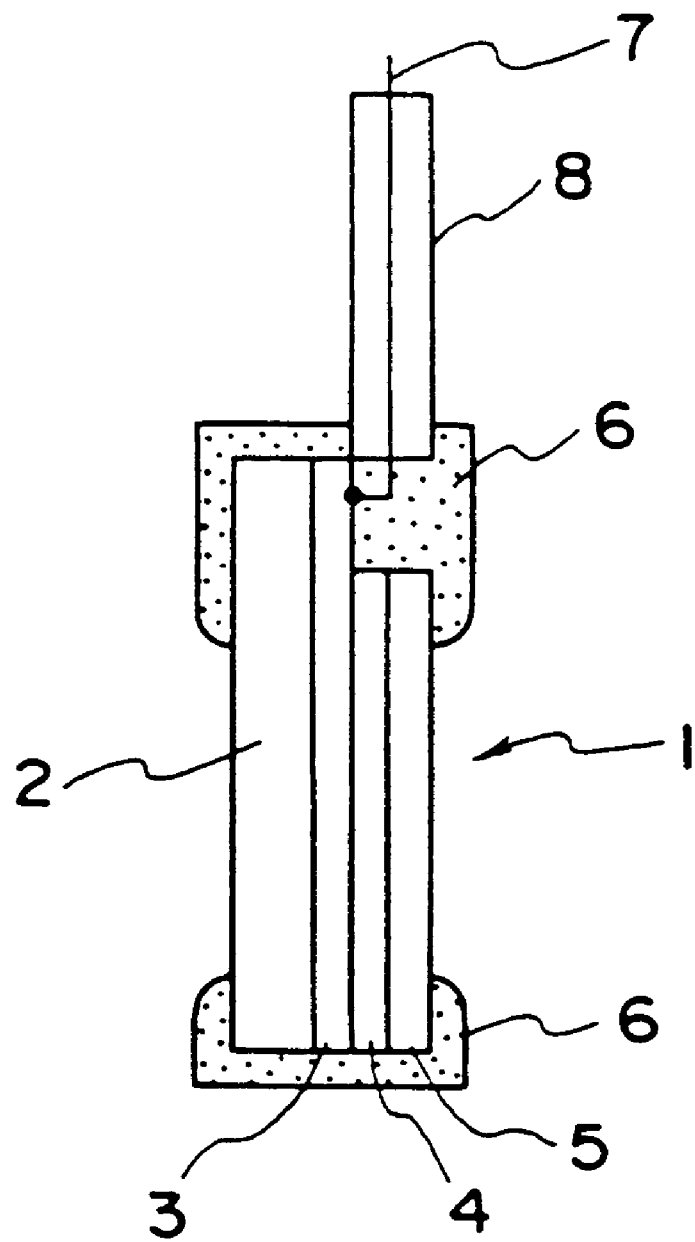
FIG. 7 is the sectional diagram of the modified electrode of Example 1.

By the procedure described above, a photo-semiconductor electrode 1 as illustrated in FIG. 7 was prepared. The photo-semiconducting electrode 1 of FIG. 7 comprises a glass substrate 2, an ITO layer 3, a titanium oxide layer 4 and a dye layer 5 composed of 3-bromopropyltrichlorosilane and 4-carboxy-2',4',5',7'-tetraiodofluorescein, in the order mentioned. The stack comprising these layers is covered and fixed with a bonding agent 6 which is an epoxy resin. A lead wire 7 is connected to a part of the ITO layer 3 so that an electric current can flow, and the lead wire 7 is enclosed in a glass tube 8.

The thus prepared photo-semiconducting electrode formed a pair with a platinum electrode which was selected as a counter electrode. The electrodes forming the pair were connected to each other by a connecting means which enabled an electric current to flow between the pair of electrodes. By this procedure, a photoelectric converting device, which comprised a pair of electrodes and a lead wire connecting the electrodes of the pair, was prepared. This photoelectric converting device was designated as the photoelectric converting device of Example 1.

Measurement of Photocurrent

Using the photoelectric converting device described above, photocurrent was measured as explained below.

Figure 8:
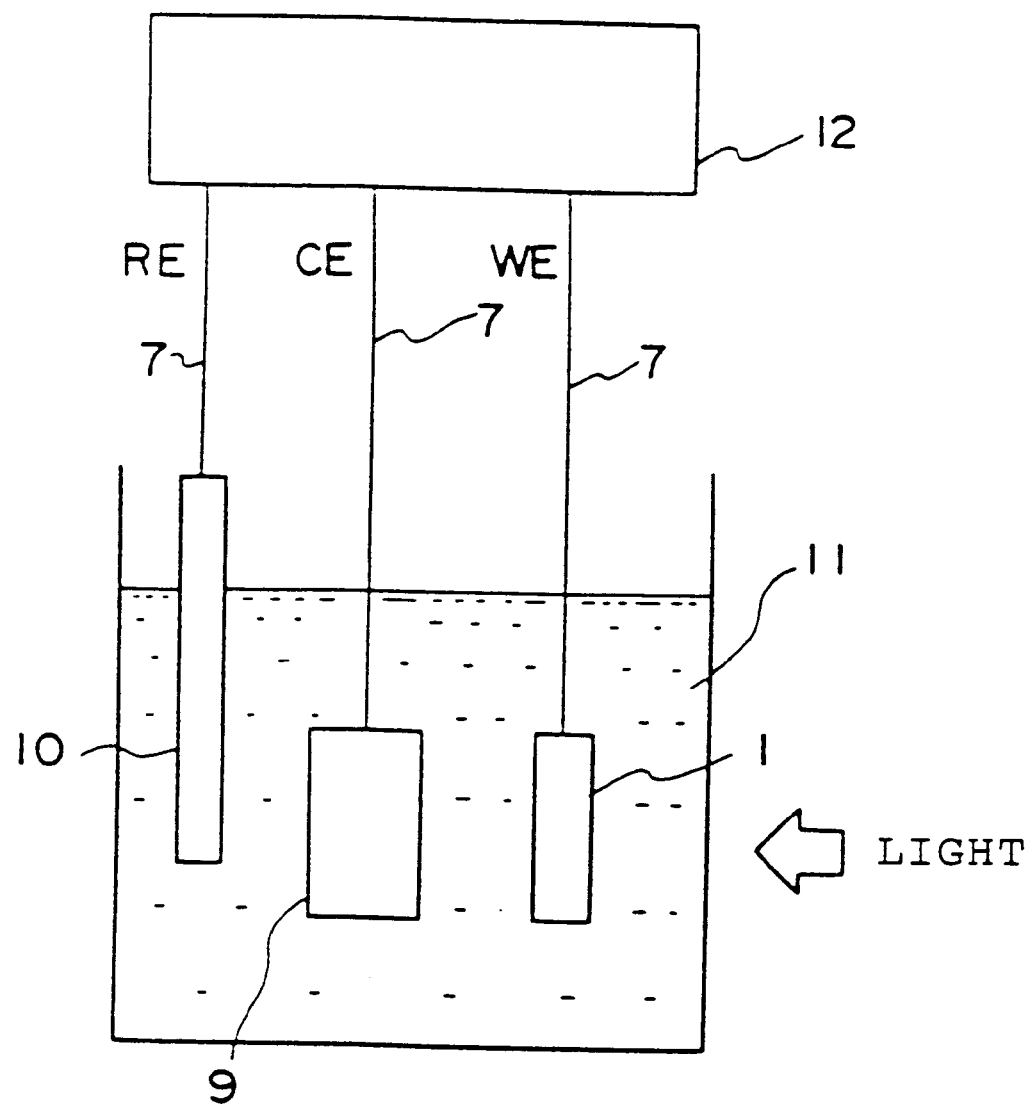
FIG. 8 is the diagram of the device for photo-induced electrolysis of Example 1.

As illustrated in FIG. 8, a pair of electrodes, i.e., a photo-semiconductor electrode 1 and a counter electrode 9, were immersed in an electrolyte solution 11. The electrolyte solution 11 contained 0.1 mol/l of sodium sulfate and 0.02 mol/l of potassium iodide as electrolyte substances dissolved in deionized and thereafter distilled water. The arrangement of FIG. 8 formed a potentiostat and further included a saturated calomel electrode (SCE) as a reference electrode 10.

Figure 9B:
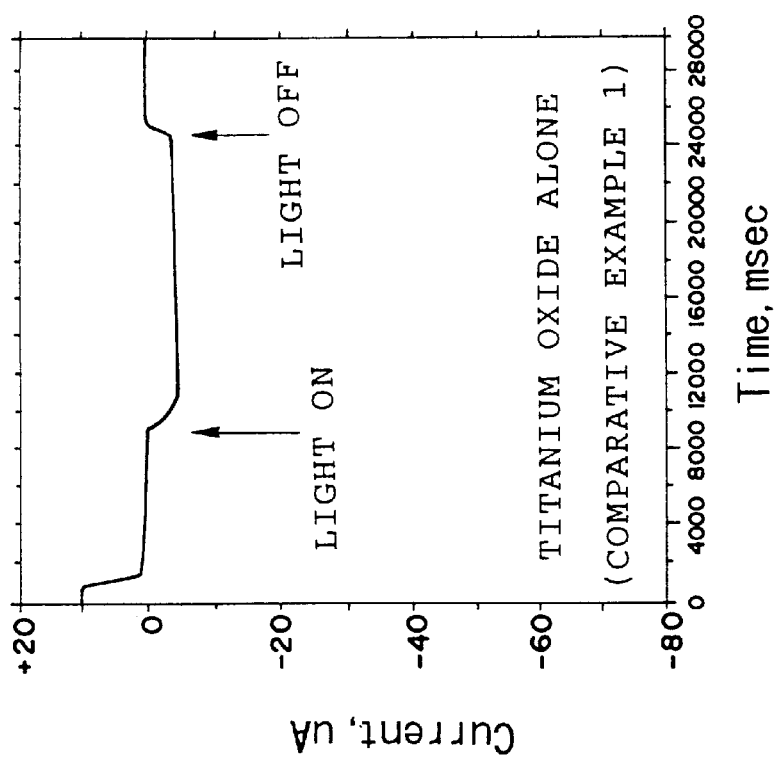
FIG. 9B shows the current-time characteristics of the modified electrode of Comparative Example 1 when irradiated with white light.
Figure 9A:
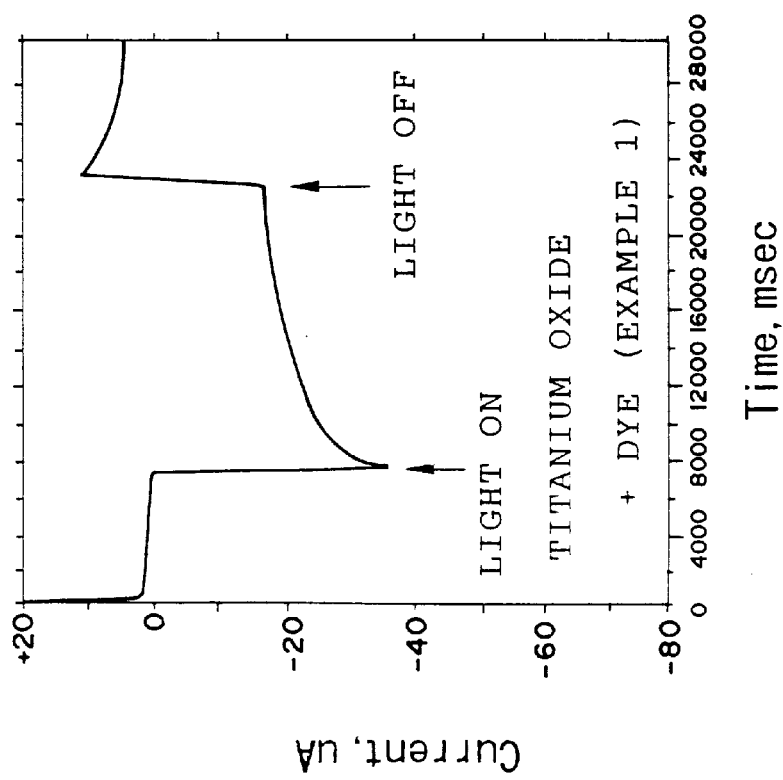
FIG. 9A shows the current-time characteristics of the modified electrode of Example 1 when irradiated with white light.

FIG. 9A shows generated photocurrent-time characteristics when the photo-semiconductor electrode (modified electrode) was kept at 0V (vs. SCE) and irradiated with white light (500 W xenon lamp light having an illumination intensity of 4000 lux). FIG. 9B (related to Comparative Example 1 described later) shows the photocurrent generated in the same way except that the photo-semiconductor electrode (modified electrode) was composed of titanium oxide having no dye fixed thereto.

Figure 10B:
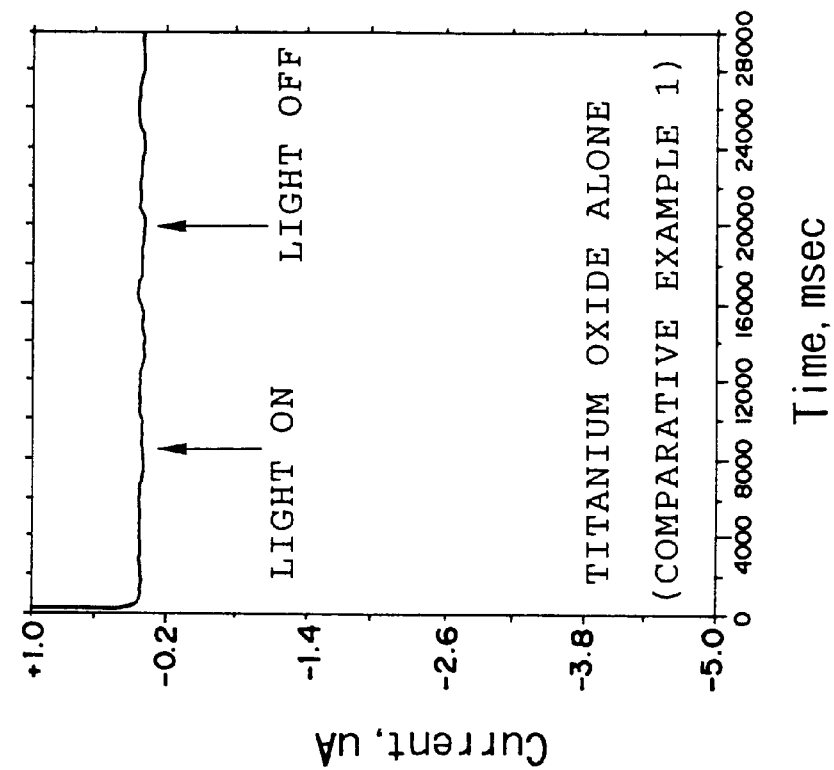
FIG. 10B shows the current-time characteristics of the modified electrode of Comparative Example 1 when irradiated with monochromatic light (550 nm).
Figure 10A:
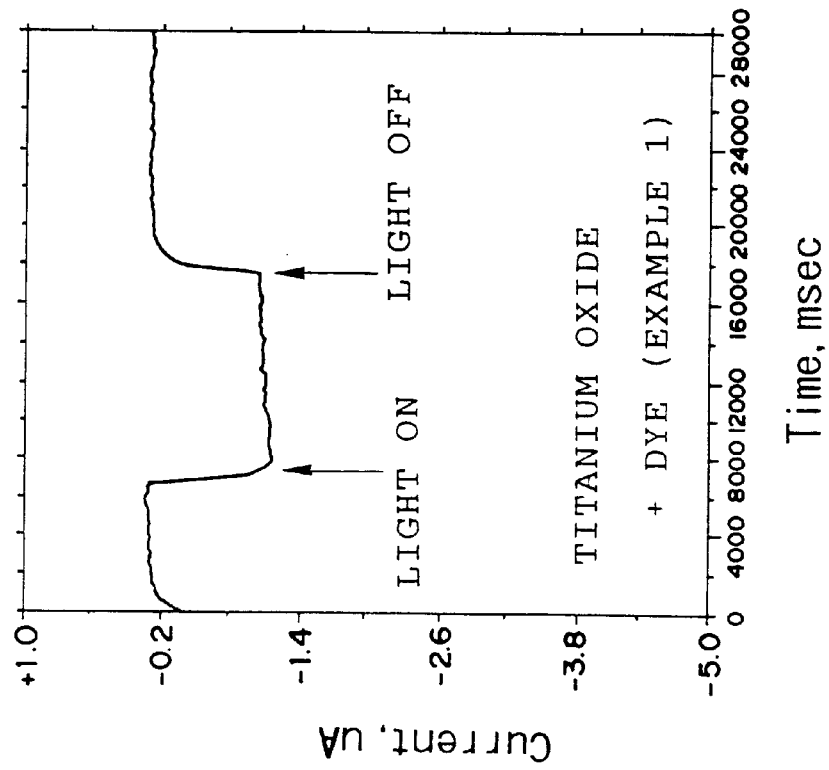
FIG. 10A shows the current-time characteristics of the modified electrode of Example 1 when irradiated with monochromatic light (550 nm)
Figure 11:
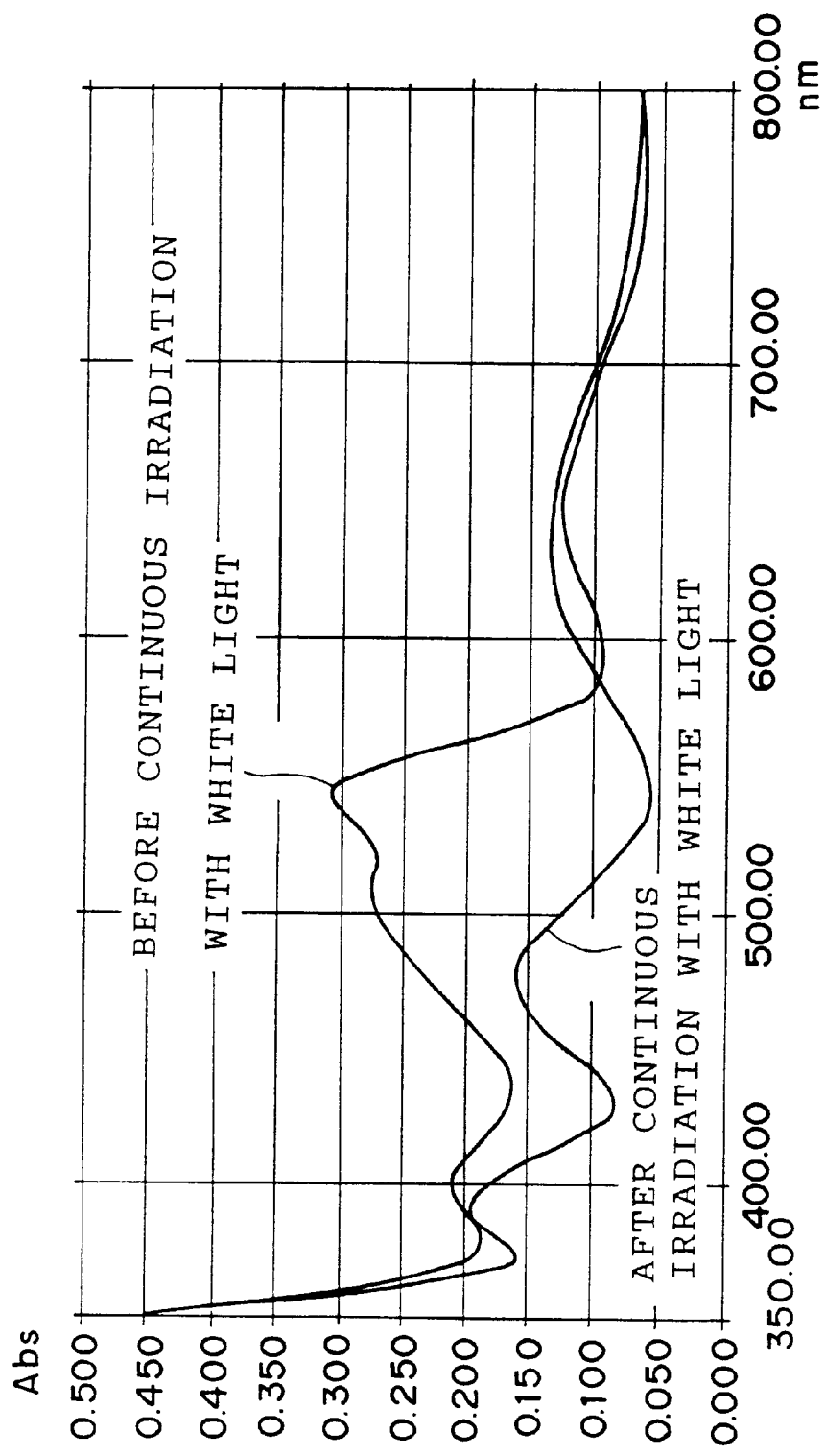
FIG. 11 shows the UV-visible light absorption spectrum of the modified electrode of Comparative Example 2.

FIG. 10A shows generated values of photocurrent as a function of time when the photo-semiconductor electrode (modified electrode) was kept at 0V (vs. SCE) and irradiated with monochromatic light of 550 nm (1 mW/cm$^2$). Apparently, the value of photocurrent generated by a modified electrode (photo-electrode) (FIG. 10A) is larger than the value of photocurrent (FIG. 10B) by a modified electrode (photo-electrode) having no dye fixed thereto (related to Comparative Example 1 described later).

In this case, the generation of gas from the surface of the photo-semiconductor electrode (modified electrode) was confirmed. Whereas almost no current flowed at a bias potential of 0V between the electrodes without irradiation, flow of current was observed when irradiated even at a bias potential of 0V between the electrodes. This fact indicates that the water underwent a photo-induced electrolysis by use of the photo-semiconductor electrode (modified electrode) even when no external bias voltage was applied.

Then, after the photo-semiconductor electrode (modified electrode) was kept at 0V (vs. SCE) and irradiated with white light (500 W xenon lamp light having an illumination intensity of 4000 lux) continuously for 1 hour, the photocurrent was measured. The results are shown in Table 10 below.

Example 2

The procedure of Example 1 was repeated, except that the 4-carboxy-2',4',5',7'-tetraiodofluorescein (the compound V-8) as used therein was replaced with Rhodamine 6G (the compound VI-7), to prepare a photo-semiconductor electrode (modified electrode) and thereafter a photoelectric converting device of Example 2 was prepared. Then, using the photoelectric converting device of Example 2, the photocurrent was measured as in Example 1. The results are shown in Table 10.

Example 3

The procedure of Example 1 was repeated, except that the 4-carboxy-2',4',5',7'-tetraiodofluorescein (the compound V-8) as used therein was replaced with bis(2,2'-bipyridine-4,4-dicarboxylic acid)ruthenium(II) dithiocyanate (the compound VII-7), to prepare a photo-semiconductor electrode (modified electrode), and thereafter a photoelectric converting device of Example 3 was prepared. Then, using the photoelectric converting device of Example 3, the photocurrent was measured as in Example 1. The results are shown in Table 10.

Example 4

The procedure of Example 1 was repeated, except that the 4-carboxy-2',4',5',7'-tetraiodofluorescein (the compound V-8) as used therein was replaced with bis(2,2'-bipyridine-)(2,2'-bipyridine-4,4-dicarboxylic acid)ruthenium(II) didichloride (the compound VIII-5), to prepare a photo-semiconductor electrode (modified electrode), and thereafter a photoelectric converting device of Example 4 was prepared. Then, using the photoelectric converting device of Example 4, the photocurrent was measured as in Example 1. The results are shown in Table 10.

Example 5

The procedure of Example 1 was repeated, except that the 4-carboxy-2',4',5',7'-tetraiodofluorescein (the compound V-8) as used therein was replaced with a tetra (n-butyl) ammonium salt (of the compound IX-1), to prepare a photo-semiconductor electrode (modified electrode) and thereafter a photoelectric converting device of Example 5 was prepared. Then, using the photoelectric converting device of Example 5, the photocurrent was measured as in Example 1. The results are shown in Table 10.

Example 6

The procedure of Example 1 was repeated, except that the 4-carboxy-2',4',5',7'-tetraiodofluorescein (the compound V-8) as used therein was replaced with tetracarboxyphthalocyaninate cobalt (II) (the compound X-9), to prepare a photo-semiconductor electrode (modified electrode), and thereafter a photoelectric converting device of Example 6 was prepared. Then, using the photoelectric converting device of Example 6, the photocurrent was measured as in Example 1. The results are shown in Table 10.

Example 7

The procedure of Example 1 was repeated, except that the 4-carboxy-2',4',5',7'-tetraiodofluorescein (the compound V-8) as used therein was replaced with meso-porphyrin-4, 4',4", 4'''-tetrabenzoic acid(the compound XI-1), to prepare a photo-semiconductor electrode (modified electrode), and thereafter a photoelectric converting device of Example 7 was prepared. Then, using the photoelectric converting device of Example 7, the photocurrent was measured as in Example 1. The results are shown in Table 10.

Example 8

The procedure of Example 1 was repeated, except that the 4-carboxy-2',4',5',7'-tetraiodofluorescein (the compound V-8) as used therein was replaced with (4,4',4",4'''-tetrapyridyl)-meso-porphyrin (the compound XI-6), to prepare a photo-semiconductor electrode (modified electrode), and thereafter a photoelectric converting device of Example 8 was prepared. Then, using the photoelectric converting device of Example 8, the photocurrent was measured as in Example 1. The results are shown in Table 10.

Example 9

The procedure of Example 1 was repeated, except that the 4-carboxy-2',4',5',7'-tetraiodofluorescein (the compound V-8) as used therein was replaced with (N,N'-bis(2-carboxyethyl)perylenediimide (the compound XII-2), to prepare a photo-semiconductor electrode (modified electrode), and thereafter a photoelectric converting device of Example 9 was prepared. Then, using the photoelectric converting device of Example 9, the photocurrent was measured as in Example 1. The results are shown in Table 10.

Example 10

The procedure of Example 1 was repeated, except that the 4-carboxy-2',4',5',7'-tetraiodofluorescein (the compound V-8) as used therein was replaced with 4-amino-fluorescein (the compound V-20), to prepare a photo-semiconductor electrode (modified electrode), and thereafter a photoelectric converting device of Example 10 was prepared. The thus obtained photo-semiconductor (modified electrode) was pinkish and transparent. The UV-visible light absorption spectrum of the photo-semiconductor (modified electrode) was found to be approximately the same as that of the solution of 4-amino-fluorescein in ethanol. Then, using the photoelectric converting device of Example 10, the photocurrent was measured as in Example 1. The results are shown in Table 10.

Example 11

The procedure of Example 1 was repeated, except that the 3-bromopropyltrichlorosilane as used therein was replaced with 8-bromooctyltrichlorosilane, to prepare a photo-semiconductor electrode (modified electrode), and thereafter a photoelectric converting device of Example 11 was prepared. Then, using the photoelectric converting device of Example 11, the photocurrent was measured as in Example 1. The results are shown in Table 10.

Example 12

The procedure of Example 1 was repeated, except that the 3-bromopropyltrichlorosilane as used therein was replaced with 3-chloropropylmethyldiethoxysilane, to prepare a photo-semiconductor electrode (modified electrode), and thereafter a photoelectric converting device of Example 12 was prepared. Then, using the photoelectric converting device of Example 12, the photocurrent was measured as in Example 1. The results are shown in Table 10.

Example 13

The procedure of Example 1 was repeated, except that the 3-bromopropyltrichlorosilane as used therein was replaced with 8-bromooctyldimetylchlorosilane, to prepare a photo-semiconductor electrode (modified electrode), and thereafter a photoelectric converting device of Example 13 was prepared. Then, using the photoelectric converting device of Example 13, the photocurrent was measured as in Example 1. The results are shown in Table 10.

Example 14

The procedure of Example 1 was repeated, except that the 3-bromopropyltrichlorosilane as used therein was replaced with 3-bromopropyltrichlorogermane, to prepare a photo-semiconductor electrode (modified electrode), and thereafter a photoelectric converting device of Example 14 was prepared. Then, using the photoelectric converting device of Example 14, the photocurrent was measured as in Example 1. The results are shown in Table 10.

Comparative Example 1

The procedure of Example 1 was repeated, except that neither 3-bromopropyltrichlorosilane nor 4-carboxy-2',4',5', 7'-tetraiodofluorescein was used, to prepare a modified electrode, and thereafter a photoelectric converting device of Comparative Example 1 was prepared. Then, using the photoelectric converting device of Comparative Example 1, the photocurrent was measured as in Example 1. The results are shown in Table 10.

Comparative Example 2

The procedure of Example 1 was repeated, except that the titanium oxide semiconducting film formed on the ITO glass underwent no chemical adsorption treatment by 3-bromopropyltrichlorosilane, and the ITO/titanium oxide composite material was immersed for 8 hours in a solution containing 4-carboxy-2',4',5',7'-tetraiodofluorescein (the compound V-8) at a concentration of $10^{-3}$ mol/l in ethanol, to prepare a modified electrode, and thereafter a photoelectric converting device of Comparative Example 2 was prepared. The UV-visible light absorption spectrum of the modified electrode of Comparative Example 2 was found to be approximately the same as that of the solution 4-carboxy-2',4',5',7'-tetraiodofluorescein in ethanol. Then, using the photoelectric converting device of Comparative Example 2, the photocurrent was measured as in Example 1. The results are shown in Table 10.

Comparative Example 3

The procedure of Example 1 was repeated, except that the titanium oxide semiconducting film formed on the ITO glass was treated with Y-aminopropyltriethoxysilane in place of 3-bromopropyltrichlorosilane, to prepare a modified electrode, and thereafter a photoelectric converting device of Comparative Example 3 was prepared. Then, using the photoelectric converting device of Comparative Example 3, the photocurrent was measured as in Example 1. The results are shown in Table 10.

TABLE 10

|  | Immediately after irradiation | | After 1 hour irradiation | |
| --- | --- | --- | --- | --- |
|  | White light | 550 nm | White light | 550 nm |
| Example 1 | 14.5 μA | 1.2 μA | 10.3 μA | 1.0 μA |
| Example 2 | 6.1 μA | 0.5 μA | 4.7 μA | 0.4 μA |
| Example 3 | 20.8 μA | 2.3 μA | 18.6 μA | 2.0 μA |
| Example 4 | 11.9 μA | 1.0 μA | 10.1 μA | 0.8 μA |
| Example 5 | 17.7 μA | 1.5 μA | 14.9 μA | 1.3 μA |
| Example 6 | 3.9 μA | 0.4 μA | 3.3 μA | 0.3 μA |
| Example 7 | 6.2 μA | 0.4 μA | 4.9 μA | 0.3 μA |
| Example 8 | 4.8 μA | 0.3 μA | 3.4 μA | 0.2 μA |
| Example 9 | 7.4 μA | 0.7 μA | 6.1 μA | 0.6 μA |
| Example 10 | 12.5 μA | 1.0 μA | 9.0 μA | 0.7 μA |
| Example 11 | 11.5 μA | 1.0 μA | 11.0 μA | 0.7 μA |
| Example 12 | 8.5 μA | 0.7 μA | 8.0 μA | 0.7 μA |
| Example 13 | 9.0 μA | 0.5 μA | 8.0 μA | 0.6 μA |
| Example 14 | 10.5 μA | 0.8 μA | 9.0 μA | 0.7 μA |
| Comparative Example 1 | 3.0 μA | 0.0 μA | 3.0 μA | 0.0 μA |
| Comparative Example 2 | 16.4 μA | 2.0 μA | 4.0 μA | 0.1 μA |
| Comparative Example 3 | 6.5 μA | 0.5 μA | 4.0 μA | 0.1 μA |

The present invention provides a photo-semiconductor electrode which solves the problems of the prior art and makes it possible to efficiently absorb solar light and perform energy conversion and which is superior in photoelectric conversion efficiency, stability and durability and can be easily produced, and also provides a photoelectric conversion method using the photo-semiconductor electrode and a photoelectric converting device suitable for the implementation of the photoelectric conversion method.

What is claimed is:

1. A photo-semiconductor electrode, comprising:

a semiconducting material;

a film formed on the semiconducting material and composed of at least one compound selected from the group consisting of compounds represented by the following formulas (I), (II), (III) and (IV); and a dye which is fixed on the surface of said film and has a functional group capable of reacting with a halogen atom:

$R^1M^1Y^1_3$                 Formula (I)

$R^1R^2M^1Y^1_2$                Formula (II)

$R^1R^2R^3M^1Y^1$               Formula (III)

$R^1$—SH                   Formula (IV)

where $R^1$ is a saturated or unsaturated aliphatic hydrocarbon group, an aromatic hydrocarbon group or a heterocycle-containing group, each having at least one halogen atom;

$R^2$ and $R^3$ are either the same as $R^1$ or each of $R^2$ and $R^3$ represents a saturated or unsaturated aliphatic hydrocarbon group, an aromatic hydrocarbon group or a heterocycle-containing group;

$M^1$ is a tetravalent element other than carbon; and $Y^1$ represents a hydrolyzable functional group and is a halogen or an alkoxy group.

2. A photo-semiconductor electrode according to claim 1, wherein said functional group capable of reacting with a halogen atom is selected from the group consisting of a carboxyl group and a primary amine.

3. A photo-semiconductor electrode according to claim 1, wherein said $M^1$ is selected from the group consisting of silicon, germanium, tin, titanium and zirconium.

4. A photo-semiconductor electrode according to claim 1, wherein said dye is at least one compound selected from the group consisting of compounds represented, respectively, by the following formulas (V), (VI), (VII), (VIII), (IX), (X), (XI) and (XII):

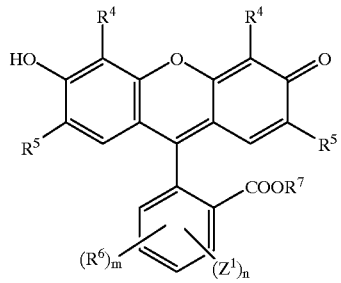

where $R^4$, $R^5$ and $R^6$ are selected from the ground consisting of a hydrogen atom, a halogen atom, —$NO_2$, —OH, an alkyl group which is optionally substituted and has 1 to 10 carbon atoms and an aromatic hydrocarbon group which is optionally substituted; m is 1, 2, 3 or 4; $R^7$ is a hydrogen atom or an aliphatic hydrocarbon group having 1 to 10 carbon atoms; $Z^1$ is selected from the group consisting of a hydrogen atom, —$NH_2$, —$NHR^8$, —OH and —COOH; n is 0, 1 or 2; and $R^8$ is an aliphatic hydrocarbon group which is optionally substituted and has 1 to 4 carbon atoms;

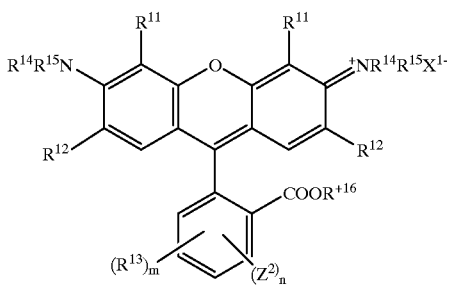

Formula (VI)

where $R^{11}$, $R^{12}$ and $R^{13}$ are selected from the group consisting of a hydrogen atom, a halogen atom, —NO$_2$, —OH, an alkyl group which is optionally substituted and has 1 to 10 carbon atoms and an aromatic hydrocarbon group which is optionally substituted; m is 1 or 2; $R^{14}$ and $R^{15}$ are selected from the group consisting of a hydrogen atom, an aliphatic hydrocarbon group which is optionally substituted and has 1 to 10 carbon atoms and an aromatic hydrocarbon group which is optionally substituted; $X^{1-}$ is a counter ion; $R^{16}$ is a hydrogen atom or an aliphatic hydrocarbon group having 1 to 10 carbon atoms; $Z^2$ is selected from the group consisting of a hydrogen atom, —NH$_2$, —NHR$^{17}$, —OH and —COOH; n is 0, 1 or 2; and $R^{17}$ is an aliphatic hydrocarbon atom group which is optionally substituted and has 1 to 4 carbon atoms, with the proviso that $Z^2$ is selected from the group consisting of —NH$_2$, —NHR$^{17}$, —OH and —COOH and n is 1 or 2 if all of $R^{14}$, $R^{15}$ and $R^{16}$ are a group other than a hydrogen atom;

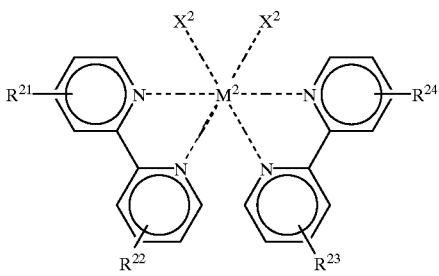

Formula (VII)

where $M^2$ is Fe, Ru or Os; $X^2$ is selected from the group consisting of a halogen atom, —OH, —CN and —SCN; $R^{21}$ to $R^{24}$ are selected from the group consisting of a hydrogen atom, a halogen atom, —NO$_2$, —COOH, —OH, —NH$_2$, —NHR$^{25}$, an aliphatic hydrocarbon group having 1 to 10 carbon atoms, an aromatic hydrocarbon group which is optionally substituted and a heterocyclic group; $R^{25}$ is an aliphatic hydrocarbon group which is optionally substituted and has 1 to 4 carbon atoms or an aromatic hydrocarbon group; and at least one of $R^{21}$ to $R^{24}$ is selected from the group consisting of —COOH, —OH, —NH$_2$, —NHR$^{25}$ and a pyridyl group;

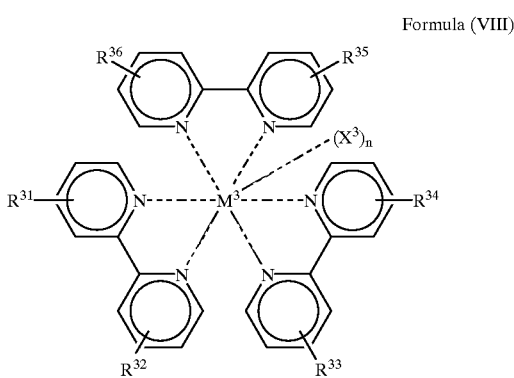

Formula (VIII)

where $M^3$ is Fe, Ru or Os; $X^3$ is selected from the group consisting of a halogen atom, —SO$_4$, —ClO$_4$, —OH, —CN and —SCN; n is 0, 1 or 2; $R^{31}$ to $R^{36}$ are selected from the group consisting of a hydrogen atom, a halogen atom, —NO$_2$, —COOH, —OH, —NH$_2$, —NHR$^{37}$, an aliphatic hydrocarbon group having 1 to 10 carbon atoms, an aromatic hydrocarbon group and a heterocyclic group; $R^{37}$ is an aliphatic hydrocarbon group which is optionally substituted and has 1 to 4 carbon atoms or an aromatic hydrocarbon group; and at least one of $R^{31}$ to $R^{36}$ is selected from the group consisting of —COOH, —OH, —NH$_2$, —NHR$^{37}$ and a pyridyl group;

Formula (IX)

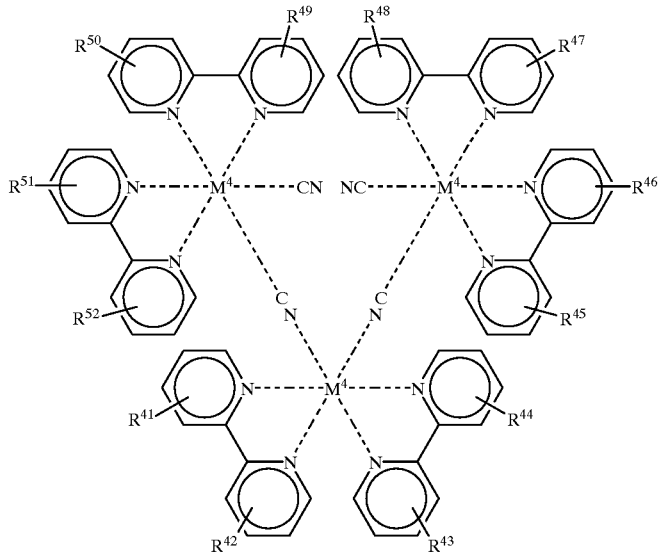

where $M^4$ is Fe, Ru or Os; $R^{41}$ to $R^{52}$ are selected from the group consisting of a hydrogen atom, a halogen atom, —$NO_2$, —COOH, —OH, —$NH_2$, —$NHR^{53}$, an aliphatic hydrocarbon group having 1 to 10 carbon atoms, an aromatic hydrocarbon group and a heterocyclic group; $R^{53}$ is an aliphatic group which is optionally substituted and has 1 to 4 carbon atoms or an aromatic hydrocarbon group; and at least one of $R^{41}$ to $R^{52}$ is selected from the group consisting of —COOH, —OH, —$NH_2$, —$NHR^{53}$ and a pyridyl group; 2;

Formula (X)

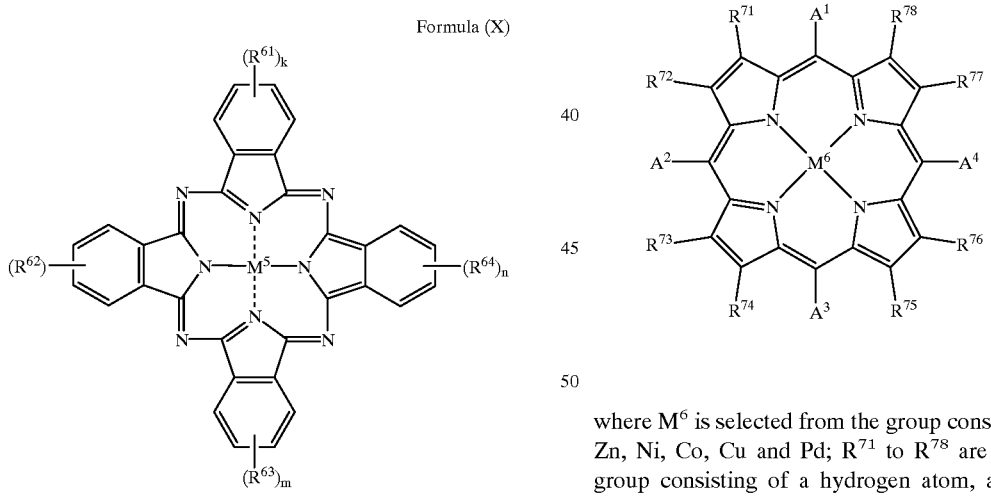

where $M^5$ is selected from the group consisting of $(H)_2$, Mg, TiO, VO, Mn, Fe, Co, Ni, Cu, Zn, GaOH, GaCl, InOH, InCl and SnO; $R^{61}$ to $R^{64}$ are selected from the group consisting of a hydrogen atom, a halogen atom, —$NO_2$, —$NH_2$, —$NHR^{65}$, —OH, —COOH, an aliphatic hydrocarbon group which is optionally substituted and has 1 to 10 carbon atoms, an aromatic hydrocarbon group which is optionally substituted and a heterocyclic group; at least one of $R^{61}$ to $R^{64}$ is selected from the group consisting of —$NH_2$, —$NHR^{65}$, —OH and —COOH; $R^{65}$ is an aliphatic group which is optionally substituted and has 1 to 4 carbon atoms or an aromatic hydrocarbon group; and k, l, m and n are each 1 or 2;

Formula (XI)

where $M^6$ is selected from the group consisting of $(H)_2$, Mg, Zn, Ni, Co, Cu and Pd; $R^{71}$ to $R^{78}$ are selected from the group consisting of a hydrogen atom, a halogen atom, a hydroxyl group, an alkoxy group which is optionally substituted and has 1 to 4 carbon atoms, an aliphatic hydrocarbon group which is optionally substituted and has 1 to 10 carbon atoms and an aromatic hydrocarbon group which is optionally substituted; $A^1$ to $A^4$ are each an aromatic hydrocarbon group which is optionally substituted or a heterocyclic group; at least one of $A^1$ to $A^4$ is a phenyl group substituted with a group selected from the group consisting of —$NH_2$, —$NHR^{79}$, —OH and —COOH or a pyridyl group; and $R^{79}$ is an aliphatic group which is optionally substituted and has 1 to 4 carbon atoms or an aromatic hydrocarbon group; and

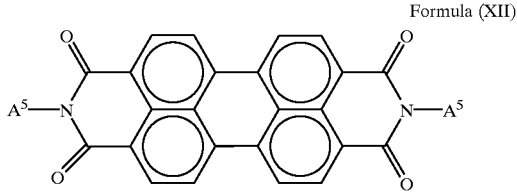

Formula (XII)

where $A^5$ is an aliphatic hydrocarbon group substituted with a group selected from the group consisting of —$NH_2$, —$NHR^{81}$, —OH, —COOH and a pyridyl group, an aromatic hydrocarbon group substituted with a group selected from the group consisting of —$NH_2$, —$NHR^{81}$, —OH, —COOH and a pyridyl group, or a pyridyl group; and $R^{81}$ is an aliphatic hydrocarbon group which is optionally substituted and has 1 to 4 carbon atoms or an aromatic hydrocarbon group.

5. A photo-semiconductor electrode according to claim 1, wherein said semiconductor material is selected from the group consisting of titanium oxide, tin oxide, tungsten oxide, zinc oxide, indium oxide, niobium oxide and strontium oxide.

6. A photo-semiconductor electrode according to claim 1, wherein said semiconductor material is titanium oxide.

7. A photoelectric converting device comprising a pair of electrodes placed in an electrolyte solution and a connecting means which enables an electric current to flow between said pair of electrodes, wherein at least one of said pair of electrodes is the photo-semiconductor electrode according to claim 1.

8. A photoelectric converting device comprising a pair of electrodes placed in an electrolyte solution and a connecting means which enables an electric current to flow between said pair of electrodes, wherein at least one of the pair of electrodes is the photo-semiconductor electrode according to claim 2.

9. A photoelectric converting device comprising a pair of electrodes placed in an electrolyte solution and a connecting means which enables an electric current to flow between said pair of electrodes, wherein at least one of the pair of electrodes is the photo-semiconductor electrode according to claim 3.

10. A photoelectric converting device comprising a pair of electrodes placed in an electrolyte solution and a connecting means which enables an electric current to flow between said pair of electrodes, wherein at least one of the pair of electrodes is the photo-semiconductor electrode according to claim 4.

11. A photoelectric converting device comprising a pair of electrodes placed in an electrolyte solution and a connecting means which enables an electric current to flow between said pair of electrodes, wherein at least one of the said pair of electrodes is the photo-semiconductor electrode according to claim 5.

12. A photoelectric conversion method comprising irradiating light onto a pair of electrodes which are connected such that an electric current flows between said pair of electrodes and placed in an electrolyte solution in order to cause a photoelectric conversion reaction, wherein at least one of said pair of electrodes is the photo-semiconductor electrode according to claim 1.

13. A photoelectric conversion method comprising irradiating light onto a pair of electrodes which are connected such that an electric current flows between said pair of electrodes and placed in an electrolyte solution in order to cause a photoelectric conversion reaction, wherein at least one of said pair of electrode is the photo-semiconductor electrode according to claim 2.

14. A photoelectric conversion method comprising irradiating light onto a pair of electrodes which are connected such that an electric current flows between said pair of electrodes and placed in an electrolyte solution in order to cause a photoelectric conversion reaction, wherein at least one of said pair of electrodes is the photo-semiconductor electrode according to claim 3.

15. A photoelectric conversion method comprising irradiating light onto a pair of electrodes which are connected such that an electric current flows between said pair of electrodes and placed in an electrolyte solution in order to cause a photoelectric conversion reaction, wherein at least one of said pair of electrodes is the photo-semiconductor electrode according to claim 4.

16. A photoelectric conversion method comprising irradiating light onto a pair of electrodes which are connected such that an electric current flows between said pair of electrodes and placed in an electrolyte solution in order to cause a photoelectric conversion reaction, wherein at least one of said pair of electrodes is the photo-semiconductor electrode according to claim 5.

17. A photoelectric conversion method according to claim 12, wherein said photoelectric conversion reaction is an electrolysis reaction.

18. A photoelectric converting device, comprising:

a pair of electrodes placed in an electrolytic solution; and an electroconductive material connector connecting the pair of electrodes such that an electric current can flow between the pair of electrodes, wherein at least one of the pair of electrodes is the photo-semiconductor electrode according to claim 4.

19. A photoelectric converting device, comprising:

a pair of electrodes placed in an electrolytic solution; and an electroconductive material connector connecting the pair of electrodes such that an electric current can flow between the pair of electrodes, wherein at least one of the pair of electrodes is the photo-semiconductor electrode according to claim 1.

* * * * *